(12) United States Patent
Shibata

(10) Patent No.: US 6,680,488 B2
(45) Date of Patent: Jan. 20, 2004

(54) SEMICONDUCTOR DEVICE

(75) Inventor: Hiroshi Shibata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/123,520

(22) Filed: Apr. 17, 2002

(65) Prior Publication Data

US 2002/0163016 A1 Nov. 7, 2002

(30) Foreign Application Priority Data

Apr. 20, 2001 (JP) ..................................... 2001-122032

(51) Int. Cl.$^7$ ............................................... H01L 29/04
(52) U.S. Cl. ........................... 257/72; 257/59; 257/749
(58) Field of Search ............................... 257/59, 72, 749

(56) References Cited

U.S. PATENT DOCUMENTS

| | | | |
|---|---|---|---|
| 5,327,001 A | * 7/1994 | Wakai et al. ............... | 257/350 |
| 5,818,552 A | 10/1998 | Sato | |
| 5,889,302 A | 3/1999 | Liu | |
| 5,953,088 A | * 9/1999 | Hanazawa et al. .......... | 349/110 |
| 6,067,131 A | 5/2000 | Sato | |
| 6,252,248 B1 | 6/2001 | Sano et al. | |
| 6,278,131 B1 | * 8/2001 | Yamazaki et al. ............ | 257/59 |
| 6,281,552 B1 | * 8/2001 | Kawasaki et al. .......... | 257/350 |
| 6,327,006 B1 | 12/2001 | Sato et al. | |
| 6,346,717 B1 | 2/2002 | Kawata | |
| 6,346,730 B1 | * 2/2002 | Kitakado et al. ........... | 257/350 |
| 6,380,561 B1 | 4/2002 | Ohtani et al. | |
| 6,392,255 B1 | 5/2002 | Shibata et al. | |
| 2003/0059986 A1 | 3/2003 | Shibata | |

FOREIGN PATENT DOCUMENTS

| | | |
|---|---|---|
| EP | 450941 | 10/1991 |
| EP | 762180 | 12/1997 |
| EP | 997769 | 5/2000 |
| JP | 59-121876 | 7/1984 |
| JP | 08-078329 | 3/1996 |
| JP | 09-043639 | 2/1997 |
| JP | 10-189999 | 7/1998 |
| JP | 2000-131716 | 5/2000 |
| JP | 2001-066638 | 3/2001 |

OTHER PUBLICATIONS

Shibata et al., U.S. Ser. No. 09/653,535, filed on Aug. 31, 2002.*

U.S. Ser. No. 09/653,535, filed: Aug. 31, 2000 "Semiconductor Device Having a Circuit Constructed of Thin Film Transistor" (Filing Receipt; Specification; Claims; Drawings and Amendments Dated Feb. 14, 2002 and Oct. 7, 2002)).

Kumar et al., IEEE Transactions on Electron Devices, vol. 45, No. 12, pp. 2514–2520 "Kink–Free Polycrystalline Silicon Double–Gate Elevated–Channel Thin–Film Transistors" (Dec. 1, 1998).

Yoo et al., Proceedings of the 4$^{th}$ Asian Symposium On Information Display pp. 219–222 (Feb. 13, 1997) "Pixel Design for TFT–LCD with Double Gate Poly–Si TFT and Double Layer Storage Capacitor".

Hirai et al., NEC Research & Development vol. 35 No. 2 pp. 165–170 "A High–Aperture–Ratio a–Si TFT Liquid Crystal Light Valve for Workstations" (Apr. 1, 1994).

* cited by examiner

*Primary Examiner*—David Nelms
*Assistant Examiner*—Andy Huynh
(74) *Attorney, Agent, or Firm*—Nixon Peabody LLP; Jeffrey L. Costellia

(57) ABSTRACT

This invention provides a liquid crystal display device having high display quality by preventing rays of light diffracted at an end part of a light shielding layer because such rays are irradiated to a semiconductor layer and invite fluctuation of TFT characteristics. To completely cut off the rays of light 117 diffracted at an end part of a third light shielding layer 108, a gate electrode 104 and a second light shielding portion 106 cover a semiconductor layer 103. In consequence, the irradiation of the rays of diffracted light can be prevented, fluctuation of TFT characteristics can be avoided and satisfactory display images can be acquired.

37 Claims, 19 Drawing Sheets

Fig. 4C1 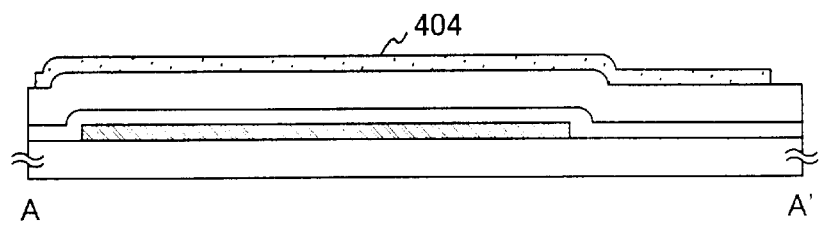
Fig. 4C2 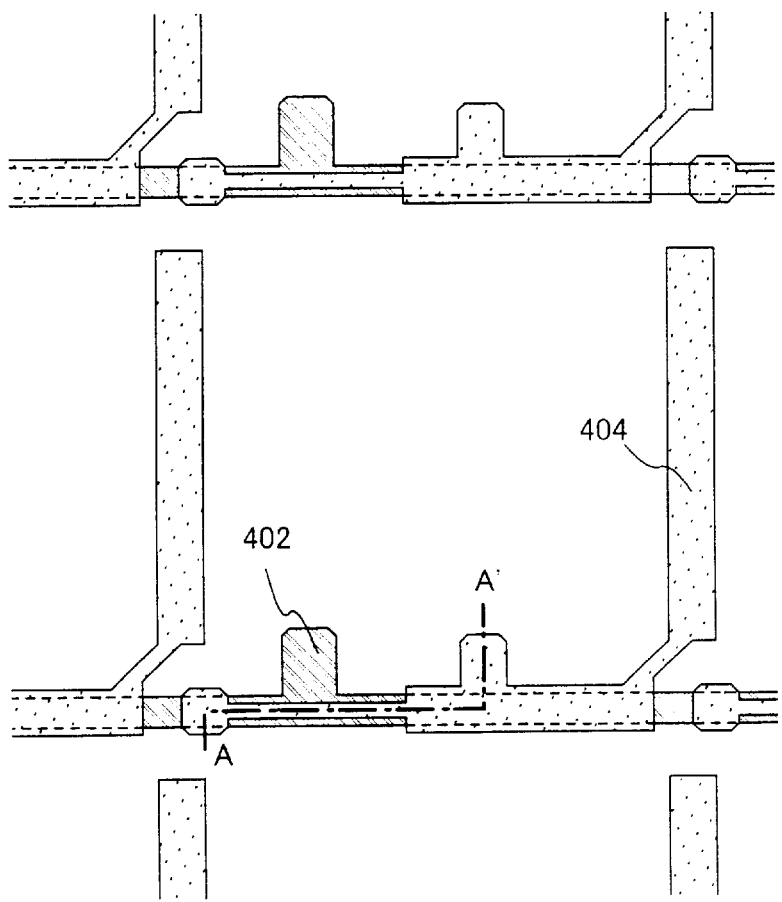

Fig. 5C1 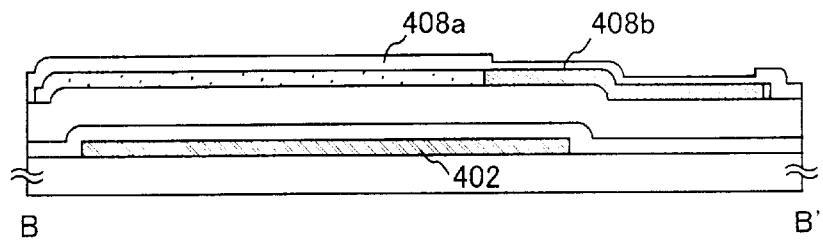
Fig. 5C2 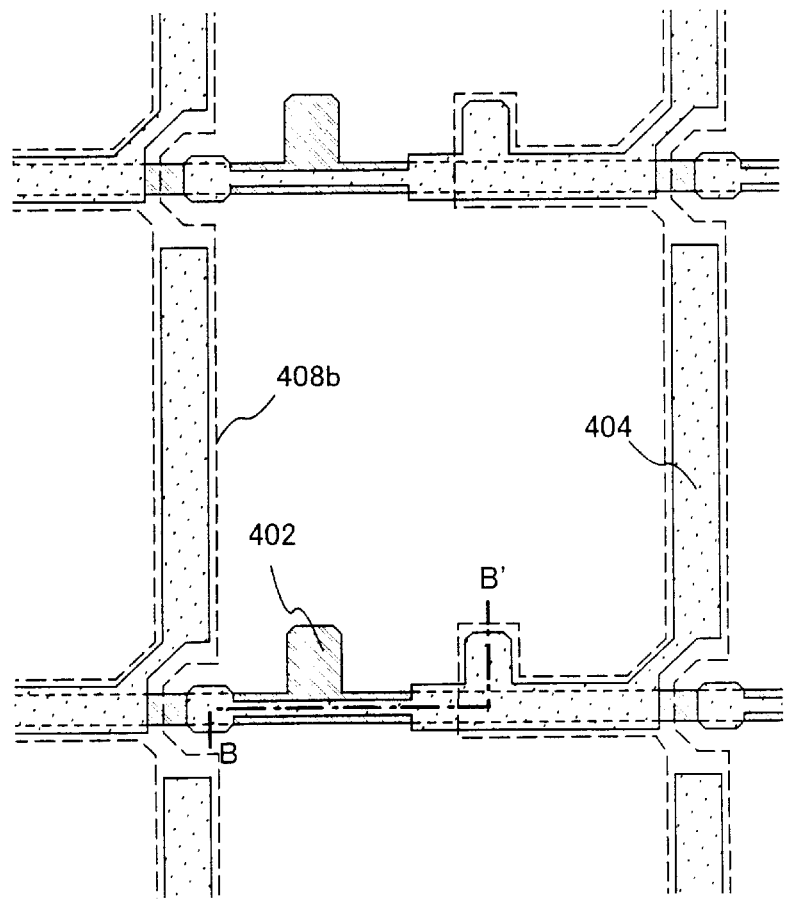

SEMICONDUCTOR DEVICE

BACKGROUND OF THE INVENTION

1. Field of the Invention

This invention relates to a semiconductor device including a circuit constituted by thin film transistors (hereinafter called "TFTs") and a fabrication method thereof. For example, the invention relates to an opto-electric device typified by a liquid crystal display panel and an electronic apparatus having such an opto-electric device as a component mounted thereto.

The term "semiconductor device" used in this specification means all those devices which function by utilizing semiconductor characteristics. Therefore, opto-electric devices, semiconductor circuits and electronic apparatuses are herein all semiconductor devices.

2. Description of the Related Art

A technology that forms a thin film transistor (TFT) by using a semiconductor thin film (thickness is several to hundreds of nm) formed on a substrate having an insulating surface has drawn an increasing attention in recent years. The thin film transistor has gained a wide application in electronic devices such as IC and opto-electric devices, and particularly development of TFT as a switching element for a liquid crystal display device has been hurriedly carried out.

To obtain high quality images in a liquid crystal display device, an active matrix type liquid crystal display device that arranges pixel electrodes in matrix and uses TFT as switching element connected to the respective pixel electrodes has drawn an attention.

To acquire high quality display in this active matrix type liquid crystal display device, each pixel electrode connected to TFT must hold a potential of a video signal till a next write operation. Generally, a storage capacitance (Cs) is provided inside the pixel so as to hold the potential of the vide signal.

Various proposals have so far been made as to the structure of the above storage capacitance (Cs) and its formation method. From the aspect of easiness of forming steps and reliability, however, preferred is a method that utilizes a gate insulating film of TFT as an insulating film having the highest quality among the insulating films constituting the pixel as a dielectric of the storage capacitance (Cs). It has been customary in the past to arrange a capacitance wire to function as an upper electrode by using a wiring layer that is the same as a scanning line, and to constitute the storage capacitance (Cs) by the upper electrode (capacitance wire)/dielectric layer (gate insulating film)/lower electrode (semiconductor film).

From the aspect of display performance, the pixel must have a large storage capacitance as well as a high aperture ratio. When each pixel has a high aperture ratio, light utilization efficiency of backlight can be improved and a backlight capacity for attaining predetermined display luminance can be limited. In consequence, power consumption of the display device and its size can be reduced. When each pixel has a large storage capacitance, display data holding performance of each pixel can be improved with the result of improvement in display quality.

These requirements impose a critical problem on miniaturization of each display pixel pitch resulting from higher precision of the liquid crystal display device (increase of the number of pixels) and the reduction of its size.

Another problem in the pixel structure according to the prior art described above is that it is difficult to simultaneously satisfy a high aperture ratio and a large storage capacitance.

Still another problem is the occurrence of fluctuation of TFT characteristics provided to each pixel and resulting degradation of image quality in a liquid crystal display device using backlight, particularly in a liquid crystal display device for a projector.

The inventor of the invention has examined the causes of fluctuation of TFT characteristics and has found it is one of problems that rays of diffracted light (also called "interference light") reach the semiconductor layer or in other words, rays of light are irradiated to the semiconductor layer while taking a detour route round an end part of a light shielding layer so disposed on the light irradiation side as to overlap with the semiconductor layer.

FIG. 2 shows a simulation result. The drawing assumes an active matrix substrate having a structure wherein a semiconductor layer 201 is formed on a substrate 200, an insulating film 202 having a thickness of 150 nm is so disposed as to cover the semiconductor layer 201 and a light shielding layer 203 having transmissivity of 0% is disposed on the insulating film 202. In this case, the end part of the light shielding layer 203 is 0 m when the rays of light are irradiated from a light source, and the intensity of diffracted light is calculated. The abscissa in the drawing represents a distance X m from the end part of the light shielding layer 203 and the ordinate does the intensity of light. The mean value of the optical intensity of the aperture portion ((−) region of the left half of the graph) is assumed to be 1.

When the end part of the light shielding layer is so arranged as to coincide with that of the semiconductor layer in FIG. 2, the intensity is the value of the ordinate of X=0 m in FIG. 2, that is, about ¼ of light from the light source. Therefore, when the end part of the light shielding layer is coincident with that of the semiconductor layer, about ¼ of the rays of light from the light source is irradiated to the semiconductor layer.

The optical intensity at X=1 $\mu$m of the ordinate is about 1/50 of light from the light source and the intensity at X=1.3 $\mu$m on the ordinate is about 1/100 of light from the light source. This means that even when the end part of the light shielding layer is spaced apart by 1 $\mu$m or by 1.3 $\mu$m from the end part of the semiconductor layer, a small amount of light is irradiated to the semiconductor layer.

The light shielding layer is disposed in existing devices but influences of diffracted light are not taken into account. In order to improve the aperture ratio, that is, in order to reduce the area of the light shielding layer, the end part of the semiconductor layer is at least brought into conformity with the end part of the light shielding layer and pixels are structured so as to merely prevent incident light from the light source.

SUMMARY OF THE INVENTION

The invention provides a solution to the problem described above from the design side and provides a liquid crystal display device having high display quality by preventing rays of light diffracted at an end part of a light shielding layer from being irradiated to a semiconductor layer, by securing a sufficient storage capacitance (Cs) while keeping a high aperture ratio, and at the same time by dispersing time-wise and reducing effectively a load of a capacitance wire (pixel write current).

One of the characterizing features of the invention resides in that a first light shielding layer or a gate electrode cuts off rays of light diffracted by a second light shielding layer disposed over a semiconductor layer. According to the result shown in FIG. 2, the area of the light shielding layer must be increased to sufficiently cut off the rays of light diffracted by one light shielding layer and as a result the aperture ratio drops. When two or more light shielding layers formed in different layers are used in superposition, however, it is possible to cut off the rays of diffracted light without increasing the area of the light shielding layers. Incidentally, a first light shielding layer may be a conductor pattern simultaneously formed with a source or drain electrode, or a part of the source or drain electrode.

According to one aspect of the invention disclosed in the present specification, there is provided a semiconductor device comprising a semiconductor layer on an insulating surface, a first insulating film on the semiconductor layer, a gate electrode overlapping with the semiconductor layer on the first insulating film, a second insulating film on the gate electrode, a first light shielding layer on the second insulating film, a third insulating film on the first light shielding layer and a second light shielding layer on the third insulating film, wherein the first light shielding layer and the gate electrode are arranged more inward than a peripheral edge part of the second light shielding layer in such a manner as to cut off rays of light diffracted by the second light shielding layer when the rays of light are irradiated from the second light shielding layer toward the semiconductor layer.

According to another aspect of the invention, there is provided a semiconductor device comprising a semiconductor layer on an insulating surface, a first insulating film on the semiconductor layer, a gate electrode overlapping with the semiconductor layer on the first insulating film, a second insulating film on the gate electrode, a first light shielding layer on the second insulating film, a third insulating film on the first light shielding layer and a second light shielding layer on the third insulating film, wherein the second light shielding layer and at least one of the gate electrode and the first light shielding layer are so arranged as to overlap each other with a full region of the semiconductor layer in a pixel portion.

In each of the aspects described above, it is another feature of the invention that the gate electrode is patterned into an island shape.

In each of the aspects described above, it is still another feature of the invention that the gate electrode comprising a film containing an element selected from the group consisting of poly-Si doped with a conductivity imparting impurity element, W, $WSi_x$, Al, Ta, Cr and Mo as the principal component or their laminate film.

It is still another feature of the invention that the second light shielding layer or the gate electrode cuts off rays of light diffracted by the third light shielding layer over the semiconductor layer, and the first light shielding layer disposed below the semiconductor layer cuts off rays of external light (or reflected light of the substrate surface). The second light shielding layer may be formed by a conductor pattern simultaneously formed with the source or drain electrode or comprise a part of the source or drain electrode.

According to still another aspect of the invention, there is provided a semiconductor device comprising a first light shielding layer on an insulating surface; a first insulating film over the first light shielding layer; a semiconductor layer on the first insulating film; a second insulating film on the semiconductor layer; a wire and a gate electrode connected to the first light shielding layer, each being formed on the second insulating film; a third insulating film on the wire and on the gate electrode; a second light shielding layer overlapping with the semiconductor layer with the third insulating film interposed therebetween; a fourth insulating film on the second light shielding layer; and a third light shielding layer on the fourth insulating film; wherein the second light shielding layer and the gate electrode cut off rays of light diffracted by the third light shielding layer when the rays of light are irradiated from the third light shielding layer towards the semiconductor layer.

It is one of the features of the construction described above that the semiconductor layer overlaps the wire with the second insulating film interposed therebetween.

It is another feature of the aspect described above that a storage capacitance using the second insulating film as a dielectric is formed in a region in which the semiconductor layer overlaps the wire with the second insulating film interposed therebetween.

It is still another feature of the aspect described above that an impurity element for imparting a conductivity type is doped to a region in the semiconductor layer where it overlaps the wire with the second insulating film interposed therebetween.

It is still another feature of the aspect described above that an electrode contacted with the semiconductor layer and a pixel electrode connected to the electrode are formed on the third insulating film. The electrode contacted with the semiconductor layer on the third insulating film is the second light shielding layer.

It is still another feature of the aspect described above that the first light shielding layer is a scanning line, the wire is a capacitance wire and the second insulating film is a gate insulating film.

It is still another feature of the aspect described above that the gate electrode is patterned into an island shape.

It is still another feature of the aspect described above that the gate electrode comprises a film using as its principal component an element selected from the group consisting of poly-Si doped with a conductivity type imparting impurity element, W, $WSi_x$, Al, Ta, Cr and Mo, or their laminate film.

BRIEF DESCRIPTION OF THE DRAWINGS

FIGS. 4A through 4C1 are sectional views of fabrication steps of the pixel portion and FIG. 4C2 is a view of its top view;

FIGS. 5A through 5C1 are sectional views of fabrication steps of the pixel portion and FIG. 5C2 is a view of its top view;

FIGS. 6A through 6C1 are sectional views of fabrication steps of the pixel portion and FIG. 6C2 is a view of its top view;

FIGS. 7A and 7B1 are sectional views of fabrication steps of the pixel portion and FIG. 7B2 is a view of its top view;

DESCRIPTION OF PREFERRED EMBODIMENTS

The invention will be explained in further detail with reference to embodiments thereof.

Figure 1:
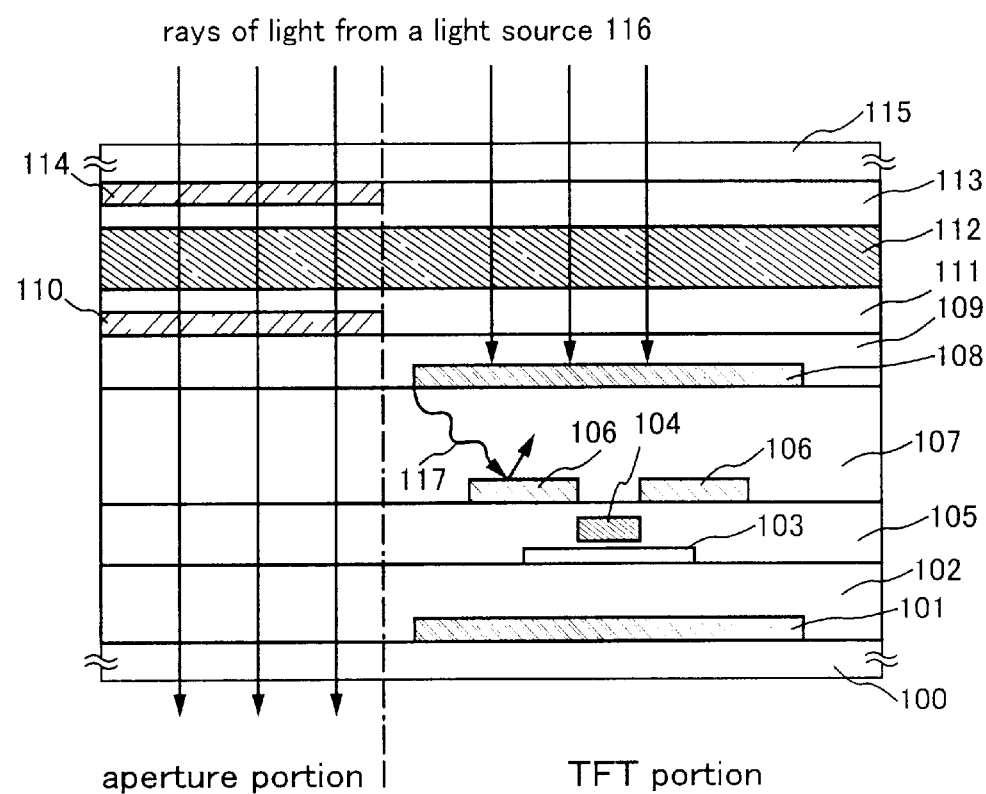
FIG. 1 shows a sectional structure of a semiconductor device.

FIG. 1 is a schematically sectional view showing one example of an embodiment of the invention. In FIG. 1, reference numeral 100 denotes a substrate. Reference numeral 101 denotes a scanning line (first light shielding layer). Reference numeral 102 denotes an insulating film. Reference numeral 103 denotes a semiconductor layer. Reference numeral 104 denotes a gate electrode. Reference numeral 105 denotes an insulating film. Reference numeral 106 denotes a second light shielding layer. Reference numeral 107 denotes an insulating film. Reference numeral 108 denotes a third light shielding layer. Reference numeral 109 denotes an insulating film. Reference numeral 110 denotes a pixel electrode. Reference numerals 111 and 113 denote orientation films. Reference numeral 112 denotes a liquid crystal material. Reference numeral 114 denotes an opposing electrode. Reference numeral 115 denotes an opposing substrate. Reference numeral 116 denotes rays of light from a light source. Reference numeral 117 denotes rays of light diffracted at an end part of the third light shielding layer.

This invention uses a part of a source or drain electrode as the second light shielding layer 106 and cuts off the rays of light 117 diffracted at the end part of the third light shielding layer without increasing the number of process steps. In this way, the invention can cut off diffracted light without sacrificing an aperture ratio.

To improve the aperture ratio and to increase a storage capacitance, the invention has its feature in that the scan line 101 (that also functions as the first light shielding layer) is formed on a layer different from the gate electrode 104. Because the storage capacitance can be thus increased, the invention can employ a pixel structure that does not render any problem even when a parasitic capacitance formed between the second light shielding layer 106 and the gate electrode 104 exists. This scanning line 101 cuts off the rays of external light (or the rays of light reflected by the substrate surface). FIGS. 3A through 3E show examples of the structure in the periphery of TFT in one of the pixels in the invention.

To concisely illustrate a laminate structure, FIGS. 3A through 3E show top views of a pixel TFT in order of process steps. Here, explanation will be briefly given on only a lamination step.

Figure 3A:
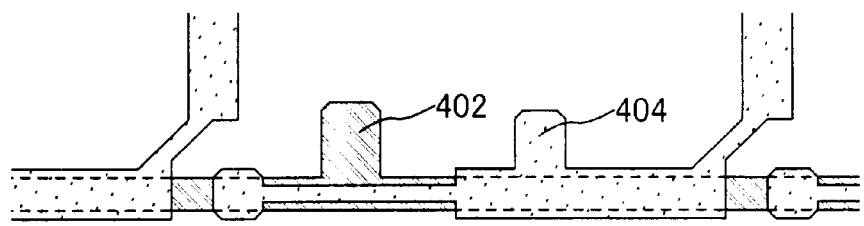
FIGS. 3A through 3E are top views showing a part of a pixel portion.

First, a scanning line 402 is formed on an insulating surface. An insulating film covering the scanning line is then formed. Next, a semiconductor layer 404 is formed on the insulating film covering the scanning line, which overlaps with at least the scan line and forms a region to function as a channel formation region (FIG. 3A). The scanning line functions as a first light shielding layer.

Figure 3B:
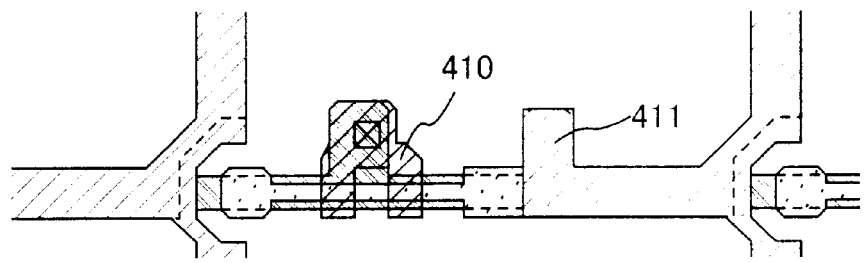

An insulating film covering the semiconductor layer is formed. A gate electrode 410 connected to the scanning line 402 and a capacitance wire 411 are simultaneously formed on the insulating film covering the semiconductor layer (FIG. 3B). A region of the semiconductor layer overlapping with the gate electrode 410 through the insulating film is to function as the channel formation region. The semiconductor layer overlapping with the capacitance wire through the insulating film is to function as one of the electrodes forming, a capacitance.

Figure 3C:
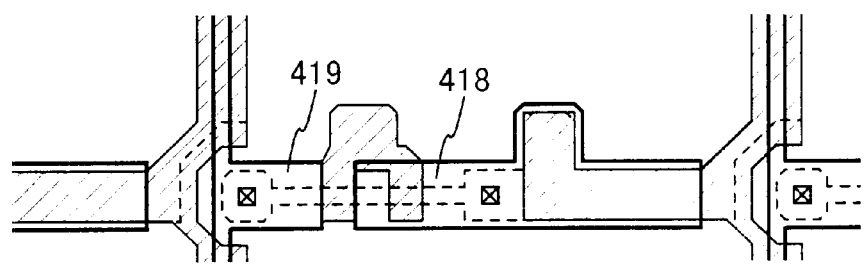

Next, an insulating film covering the gate electrode and the capacitance wire is formed. A source line (inclusive of a source electrode) 419 connected with the semiconductor layer and a drain electrode 418 connected to the semiconductor layer are simultaneously formed on the insulating film covering the gate electrode and the capacitance wire (FIG. 3C). At this stage, the semiconductor layer is allowed to overlap throughout its entire region with at least one of the gate electrode, the source line and the drain electrode. A part of the source line or a part of the drain electrode functions as the second light shielding layer.

Figure 3D:
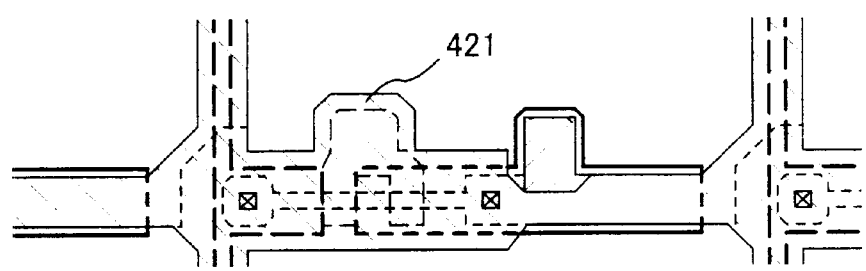

An insulating film covering the source or drain electrode is formed and a third light shielding layer 421 is formed on the insulating film covering the Source or drain electrode (FIG. 3D). Incidentally, the pattern peripheral part of the third light shielding layer is arranged with a certain margin outside the pattern of the gate electrode. Since the second and third light shielding layers are disposed, it becomes possible to prevent the rays of light diffracted at the end part of the third light shielding layer from being irradiated to the semiconductor layer.

Figure 3E:
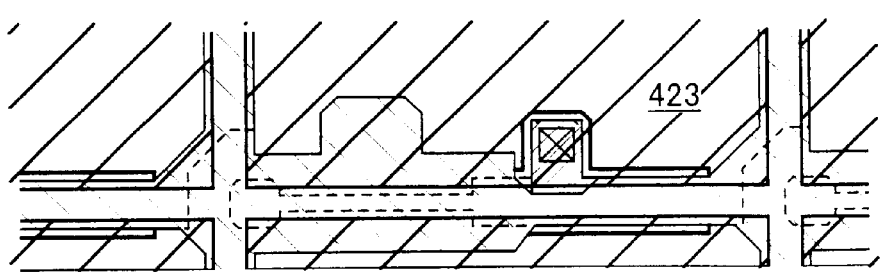

Next, an insulating film covering the third light shielding layer is formed and a pixel electrode 423 connected with the drain electrode is formed on the insulating film covering the third light shielding layer (FIG. 3E). Since the third tight shielding layer cannot be disposed at the connection position of the pixel electrode and the drain electrode, it is preferred to secure as much as possible a distance between the channel formation region and the connection position.

The storage capacitance in the invention uses the semi-conductor film for its lower electrode, the insulating film covering the semiconductor film for its dielectric and the capacitance wire 411 for its top electrode. The storage capacitance may be increased by locally reducing the film thickness of the insulating film covering the semiconductor film.

According to this construction, TFT of each pixel can assume a dual gate structure having the gate electrodes above and below the channel formation region through the insulating film. When the thickness of the insulating film covering the scanning line is set to a suitable film thickness, TFT characteristics can be improved while suppressing the parasitic capacitance created by the scanning line and other wires.

Unlike the prior art devices (in which the capacitance wire is parallel to the scanning line), it is one of its features of the invention that the capacitance wire is arranged parallel to the source line. A write operation of an image signal is continuously made to pixels corresponding to each scanning line. In this instance, since each pixel is connected to the storage capacitance formed of the capacitance wire, fluctuation of each the independent capacitance wire potential due to the write current to the adjacent pixels can be avoided and a satisfactory display image can be acquired.

To prevent the drop of the source line potential (write potential) during the write period to each scanning line, the prior art devices include a sample-and-storage capacitance in each source line. In the invention, however, the capacitance wire is arranged in such a manner as to be parallel to and to overlap with the signal line. Consequently, because the parasitic capacitance of the source line increases and improves hold performance of the source line potential, it is not necessary in the invention to provide the sample-and-storage capacitance to the peripheral circuit portion, and the size of the peripheral circuit can be made smaller than in the prior art devices.

For the same reason as described above, required performance for the capacitance wire resistance can be mitigated. Therefore, design freedom of the arrangement of the capacitance wire, its size and its film thickness can be improved, and the range of selection of the capacitance wire materials can be expanded. In consequence, difficulty in design and fabrication can be mitigated and higher production yield can be achieved.

The invention having the construction described above will be explained in further detail about embodiments thereof.

Embodiment

Embodiment 1

The invention will be explained about a projection type point sequential driving liquid crystal display device by way of example.

An active matrix type liquid crystal display device using TFTs as switching elements has a structure that a substrate on which pixel electrodes are arranged in matrix (active matrix substrate) and an opposing substrate on which opposing electrode is formed are arranged in opposing each other through a liquid crystal layer. The spacing between both substrates is controlled to a predetermined spacing by using a spacer, and a seal member is applied to an outer peripheral portion of a pixel portion to seal a liquid crystal layer into the spacing.

The active matrix substrate includes the pixel portion, a scanning line driving circuit formed around the pixel portion and a source line driving circuit.

The scanning line driving circuit mainly comprises shift registers for sequentially transferring scanning signals. The source line driving circuit mainly comprises shift registers and a sample-and-hold circuit for sampling image signals inputted on the basis of the shift register output, holding the image signals so sampled and driving the source lines.

In the pixel portion, a plurality of scanning lines (gate wires) connected to the scanning line driving circuit, which arranged parallel to each other with keeping predetermined spacing and a plurality of source lines connected to the source line driving circuit, which arranged parallel to each other with keeping predetermined spacing, are arranged such that the plurality of scanning lines intersect with the plurality of source lines. A TFT is arranged at each intersection point of the plurality of scanning lines and the plurality of source lines. A pixel electrode is arranged in each region defined by the plurality of scanning lines and the plurality of source lines. According to the above construction, each pixel electrode is arranged in matrix. A plurality of capacitance wires connected to GND (ground) or to a fixed potential are disposed in parallel with the source lines.

A fabrication process of the semiconductor device in this Embodiment will be briefly explained. FIGS. 4A to 9B showing a top view of a part of the pixel portion and its sectional view are referred.

Figure 4A:
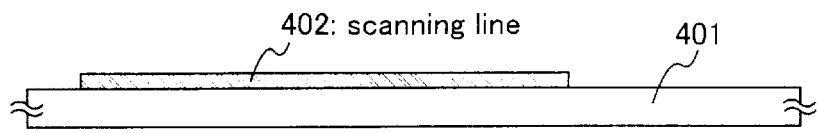

First, a conductive film is formed on a substrate 401 having an insulating surface and is patterned to form scanning lines 402 (FIG. 4A).

The scanning line 402 functions also as a light shielding layer for protecting an active layer that is to be later formed from light. The substrate 401 uses a quartz substrate. The scanning line 402 uses a laminate structure of a poly-silicon film (50 nm thick) and a tungsten silicide (W—Si) film (100 nm thick). The poly-Si film protects contamination of the substrate from tungsten silicide. Besides the quartz substrate, the substrate 401 may use a glass substrate or a plastic substrate. When the glass substrate is used, it may be heat-treated in advance at a temperature lower by about 10 to about 20° C. than a glass distortion point. An underlying layer formed from an insulating film such as a silicon oxide film, a silicon nitride film or a silicon oxynitride film is preferably formed on the surface of the substrate 401 on which TFT is formed, to prevent diffusion of impurities from the substrate 401. The scanning line 402 can use poly-Si doped with an impurity element for imparting a conductivity type or a conductive material such as $WSi_x$ (x=2.0 to 2.8), Al, Ta, W, Cr or Mo, or their laminate structure.

Figure 4B:
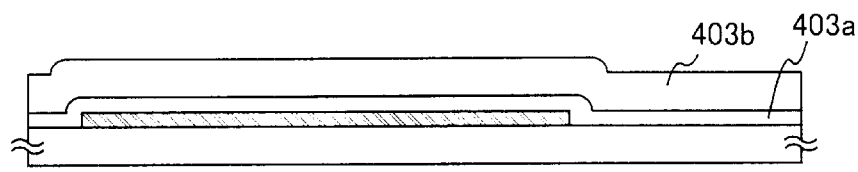

Next, insulating films 403a and 403b for covering the scanning lines 402 are formed to a thickness of 100 to 1,000 nm (typically 300 to 500 nm) (FIG. 4B). Here, a silicon oxide film formed to a thickness of 100 nm by CVD and a silicon oxide film formed to a thickness of 280 nm by LPCVD are laminated.

After the insulating film 403b is formed, the surface of the insulating film may be chemically and mechanically polished (typically by CMP) and made flat. For example, the surface is planarized so that its maximum height (Rmax) is not greater than 0.5 µm, preferably not greater than 0.3 µm.

Next, an amorphous semiconductor film is formed to a film thickness of 10 to 100 nm. Here, the LPCVD process is used to form a 69 nm-thick amorphous silicon film. The technology disclosed in Japanese Patent Laid-Open No. 8-78329 is used to crystallize this amorphous semiconductor film. The reference discloses the technology that a metal element for promoting crystallization is selectively added to the amorphous silicon film and a crystalline silicon film is formed with expanding the addition region of the metal element as the starting point by heat-treatment. Nickel is used as the metal element for promoting crystallization. After heat-treatment (at 450° C. for one hour) is carried out for dehydrogenation, heat-treatment (at 600° C. for 12 hours) is conducted for crystallization. Next, a laser beam (XeCl: wavelength 308 nm) is irradiated to improve a crystallization ratio and to repair defects that are left inside crystal grains. An excimer laser beam having a wavelength of up to 400 nm or the second or third harmonic of YAG laser is used as the laser beam. In any case, a pulse laser beam having a repetition frequency of about 10 to about 1,000 Hz is used, is condensed to 100 to 400 mJ/cm$^2$ by using an optical system, is irradiated with an overlap ratio of 90 to 95% to be scanned on the silicon film surface.

Next, Ni is gettered from a region that is to function as the active layer of TFT. This embodiment represents an example that uses a semiconductor film containing a rare gas element as the gettering method. In addition to the oxide film formed by irradiating the laser beam as described above, the film surface is then treated with ozone water for 120 seconds to form a barrier layer made of an oxide film having a total thickness of 1 to 5 nm. An amorphous silicon film containing an argon element as a gettering site is formed to a thickness of 150 nm on the barrier layer by a sputtering process. In the film formation condition of the sputtering process in this embodiment, a film formation pressure is 0.3 Pa, a gas (Ar) flow rate is 50 (sccm), film formation power is 3 kW, and a substrate temperature is 150° C. The atomic concentration of the argon element contained in the amorphous silicon film under the above condition is $3\times10^{20}/cm^3$ to $6\times10^{20}/cm^3$ and the atomic concentration of oxygen is $1\times10^{19}/cm^3$ to $3\times10^{19}/cm^3$. Heat-treatment is then carried out at 650° C. for 3 minutes by using a lamp annealing apparatus for gettering. An electric furnace may be used in place of the lamp annealing apparatus.

The amorphous silicon film containing the argon element as the gettering site is selectively removed by using the barrier layer as an etching stopper. Thereafter, the barrier layer is selectively removed by using dilute hydrofluoric acid. Since nickel is likely to migrate to a region having a high oxygen concentration during gettering, it is preferred to remove the barrier layer made of the oxide film after gettering.

Figure 2:
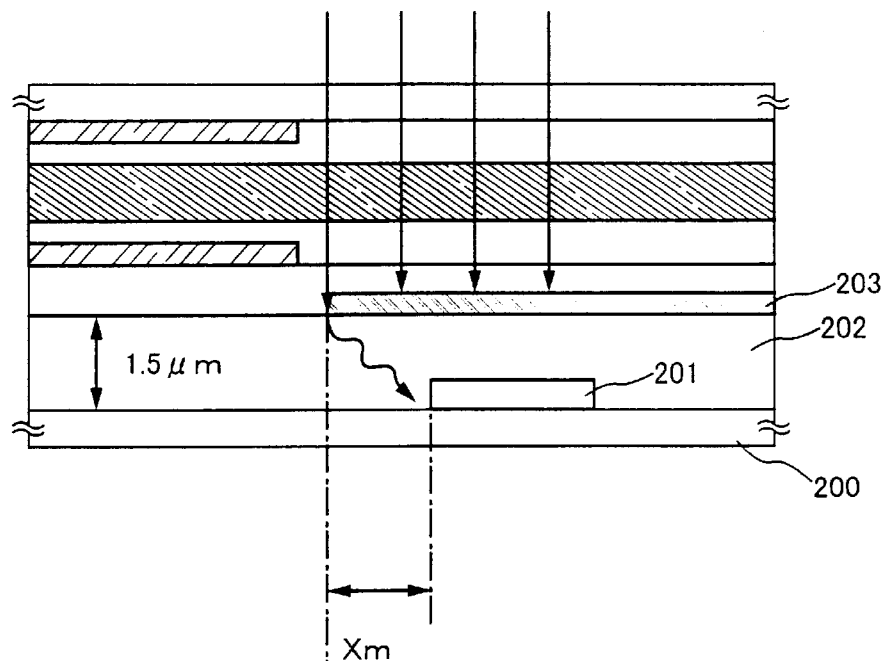
FIG. 2 shows a relation between an optical intensity of light diffracted at an end part of a light shielding layer and a distance from the end part of the light shielding layer.
Figure 2:
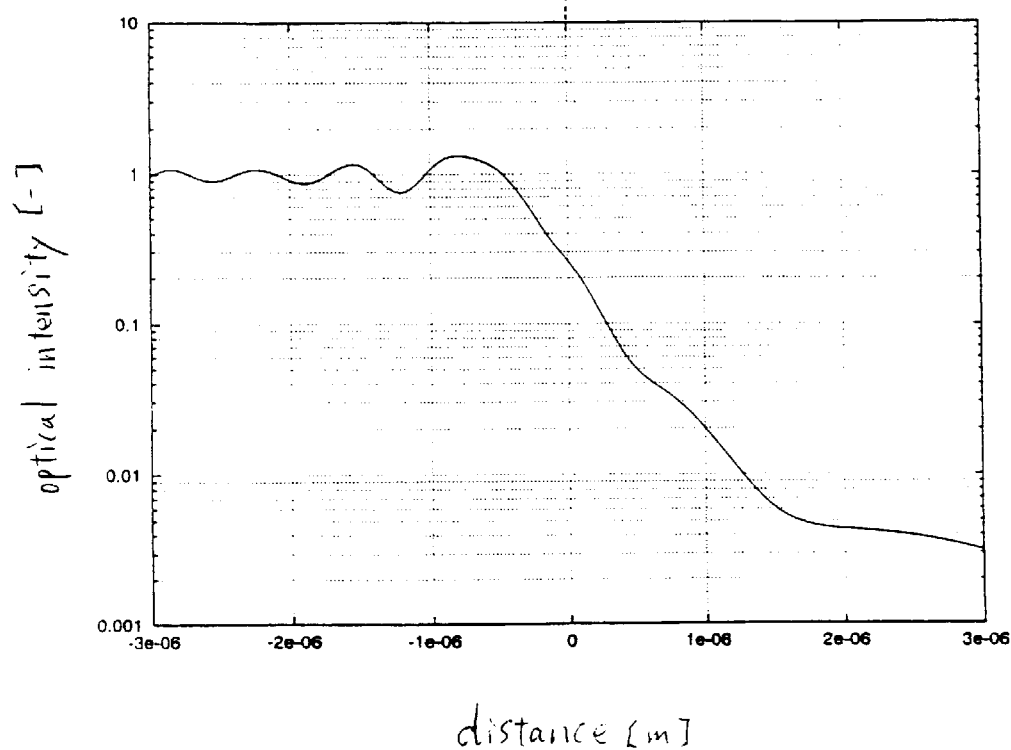

Next, a thin oxide film is formed on the surface of the resulting silicon film having the crystalline structure (also called the "poly-silicon film") by using ozone water and a resist mask is formed thereon. The silicon film is etched to obtain a desired shape, and thus a semiconductor layer 404 isolated in an island shape is formed. The resist mask is removed after the semiconductor layer 404 is formed (FIG. 4C1). FIG. 4C2 is a top view of the pixel after the semiconductor layer 404 is formed. A sectional view taken along a dotted line A–A' in FIG. 4C2 corresponds to FIG. 4C1. FIG. 4C2 corresponds also to FIG. 3A showing the foregoing embodiment, and like reference numerals are used to identify like constituent members.

After the semiconductor layer is formed, an impurity element for imparting a p type or an n type may be added to control a threshold value (Vth) of TFT. The elements of the Group XIII of the Periodic Table such as boron (B), aluminum (Al) and gallium (Ga) are known as the impurity elements that impart the p type to the semiconductor. The elements belonging to the Group XV of the Periodic Table typified by phosphorus (P) and arsenic (As) are known as the impurity elements that impart the n type to the semiconductor.

Figure 5A:
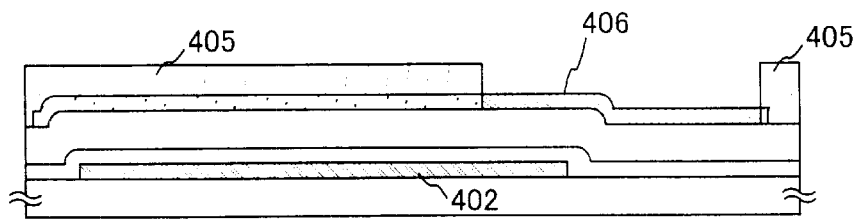

Next, to form the storage capacitance, a mask 405 is formed and phosphorus is doped into a part of the semiconductor layer (region to function as the storage capacitance) 406 (FIG. 5A).

Figure 5B:
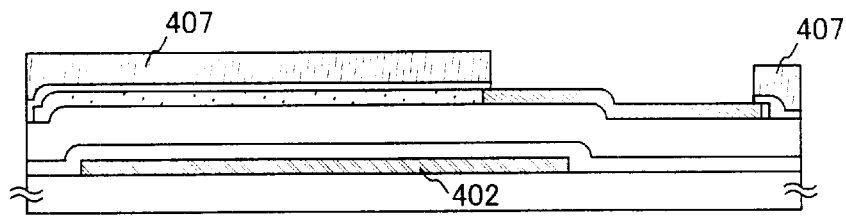

After the mask 405 is removed, an insulating film is formed in such a manner as to cover the semiconductor layer. A mask 407 is then formed, and the insulating film on the region 406 to function as the storage capacitance is removed (FIG. 5B).

Next, the mask 407 is removed and thermal oxidation is carried out to form an insulating film (gate insulating film) 408a. Due to this thermal oxidation, the final film thickness of the gate insulating film becomes 80 nm. Incidentally, an insulating film 408b thinner than the other regions is formed on the region to function as the storage capacitance (FIG. 5C1). FIG. 5C2 is a top view of the pixel at this stage. A sectional view taken along a dotted line B–B' in FIG. 5C2 corresponds to FIG. 5C1. The region inside the chain lines in FIG. 5C2 is the portion where the thin insulating film 408b is formed.

Next, a channel dope step of adding a p or n type impurity element in a low concentration to a region to function as a channel region of TFT is conducted either to the entire surface or selectively. This channel dope step is the one that controls the threshold voltage of TFT. Here, boron is doped by an ion dope method of plasma excitation of diborane ($B_2H_6$) without mass isolation. Needless to say, an ion implantation process with mass isolation may be carried out, too.

Figure 6A:
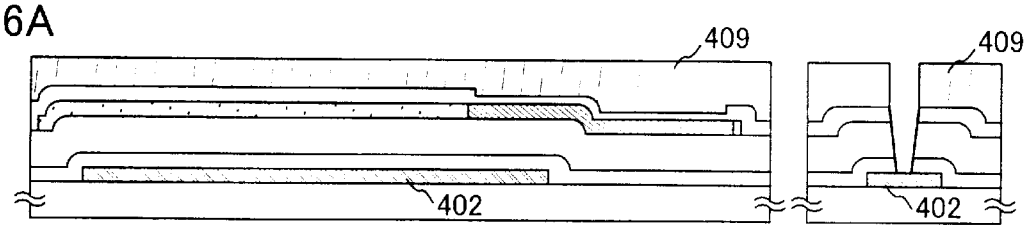

A mask 409 is formed on the insulating film 408a and the insulating films 403a and 403b, and contact holes are formed in such a manner as to reach the scanning lines 402 (FIG. 6A). The mask is removed after the contact holes are formed.

Figure 6B:
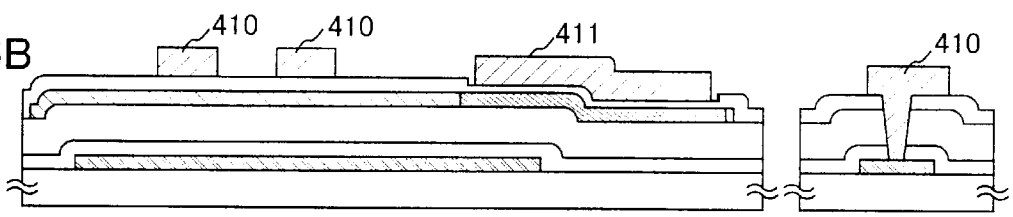
Figure 6B:
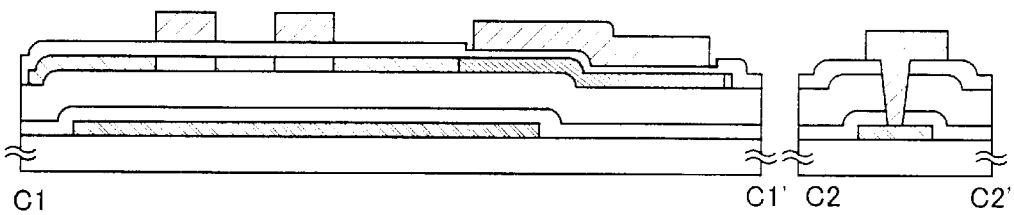
Figure 6B:
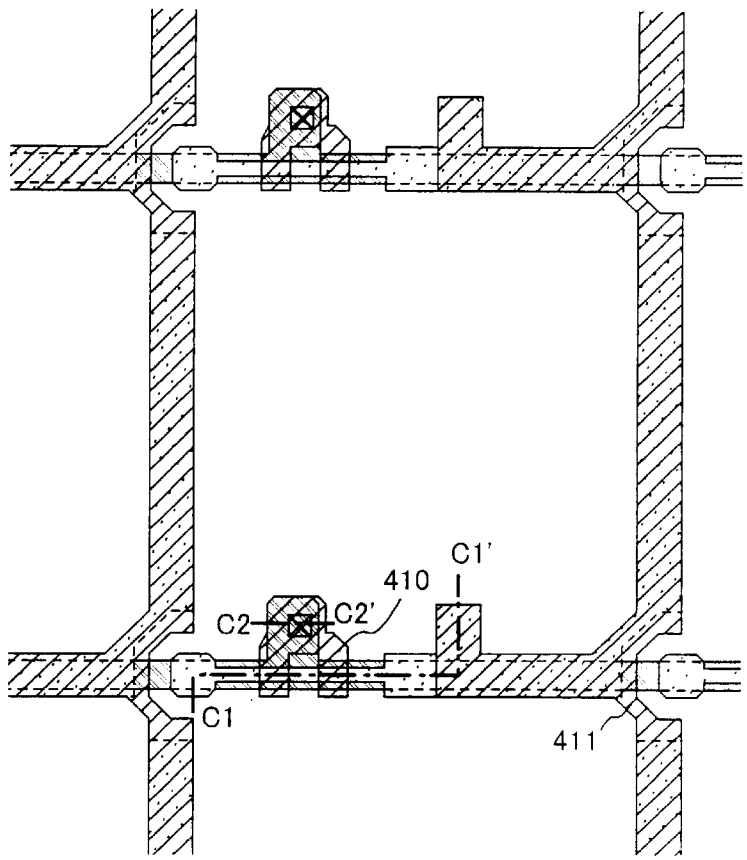

A conductive film is formed and is then patterned to give gate electrodes 410 and a capacitance wire 411 (FIG. 6B). This embodiment uses a laminate structure of a silicon film (150 nm thick) doped with phosphorus and tungsten silicide (150 nm thick) as the gate electrodes 410 and the capacitance wire 411. The storage capacitance uses the insulating film 408b as the dielectric and is constituted by the capacitance wire 411 and a part of the semiconductor layer 406.

Next, phosphorus is doped in a low concentration and in self-alignment with the gate electrode 410 and the capacitance wire 411 as the mask (FIG. 6C1). FIG. 6C2 shows a top view of the pixel at this stage. In FIG. 6C2, the sectional view taken along a dotted line C1–C1' and the sectional view taken along the line C2–C2' correspond to FIG. 6C1. The phosphorus concentration doped in a low concentration is regulated to $1\times10^{16}$ to $5\times10^{18}$ atoms/$cm^3$, typically $3\times10^{17}$ to $3\times10^{18}$ atoms/$cm^3$. FIG. 6C2 corresponds also to FIG. 3B in the foregoing embodiment, and like reference numerals are used to identify like constituent members.

Figure 7A:
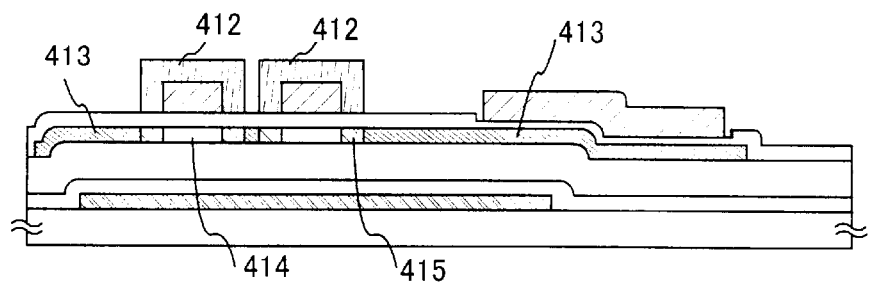
Figure 7A:
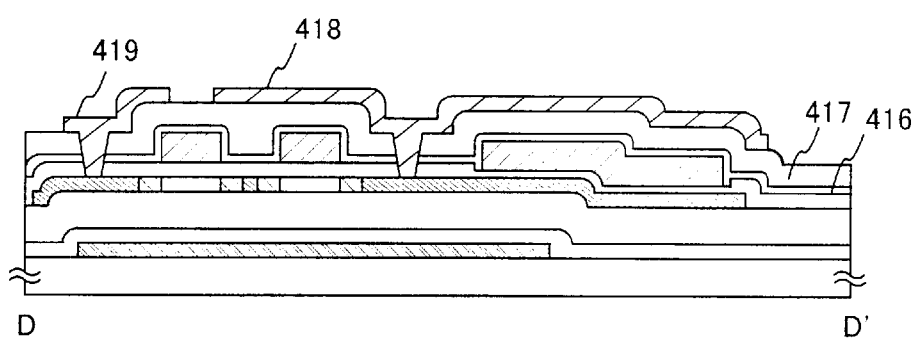
Figure 7A:
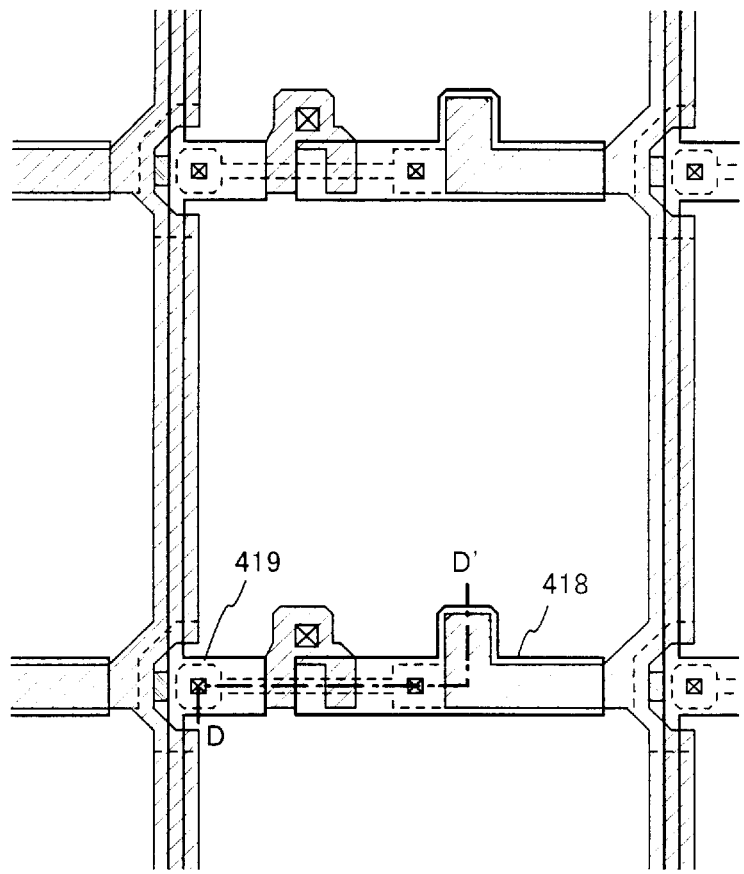

A mask 412 is then formed and phosphorus is doped in a high concentration to form a high concentration impurity region 413 that is to function as a source region or a drain region (FIG. 7A). The phosphorus concentration in the high concentration impurity region is regulated to $1\times10^{20}$ to $1\times10^{21}$ atoms/$cm^3$ (typically $2\times10^{20}$ to $5\times10^{20}$ atoms/$cm^3$). Incidentally, a region of the semiconductor layer 404 overlapping with the gate electrode 410 is a channel formation region 414 and a region of the semiconductor layer 404 covered with the mask 412 is a low concentration impurity region 415 that is to function as an LDD region. After the impurity element is doped, the mask 412 is removed.

To form p-channel TFT used for a driving circuit formed over the same substrate as the pixels, a mask covers a region to function as n-channel TFT and boron is doped to form the source or drain region, though not shown in the drawing.

After the mask 412 is removed, a passivation film 416 is formed in such a manner as to cover the gate electrodes 410 and the capacitance wire 411. Here a silicon oxide film is formed to a thickness of 70 nm. Heat-treatment is then carried out to activate the n or p type impurity element doped in a respective concentration to the semiconductor layer. Here, heat-treatment is carried out at 850° C. for 30 minutes.

Next, an interlayer insulating film 417 made of an organic resin material is formed. This embodiment uses a 400 nm-thick acrylic resin film. After contact holes reaching the semiconductor layer are formed, the drain electrode 418 and the source line 419 are formed. In this embodiment, the drain electrode 418 and the source line 419 are made from a three-layered laminate film that a 100 nm-thick Ti film, a 300 nm-thick Ti-containing aluminum film and a 150 nm-thick Ti film are continuously formed by a sputtering process (FIG. 7B1). The source line 419 and the drain electrode 418 cut off the rays of light to the semiconductor layer as shown in FIG. 7B1. The source line 419 and the drain electrode 418 cut off the ray of light diffracted at an end part of the light shielding layer that is to be later formed. Incidentally, the sectional view taken along a dotted line D–D' in FIG. 7B2 corresponds to FIG. 7B1. FIG. 7B2 corresponds also to FIG. 3C showing the foregoing embodiment, and like reference numerals are used to identify like constituent members.

Figure 8A:
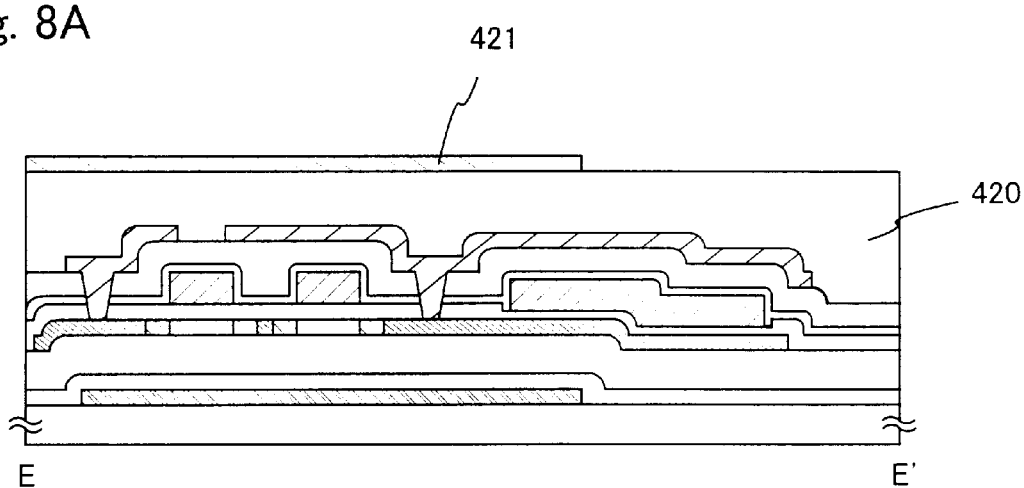
FIGS. 8A and 8B are a sectional view of fabrication steps of the pixel portion and its top view.
Figure 8B:
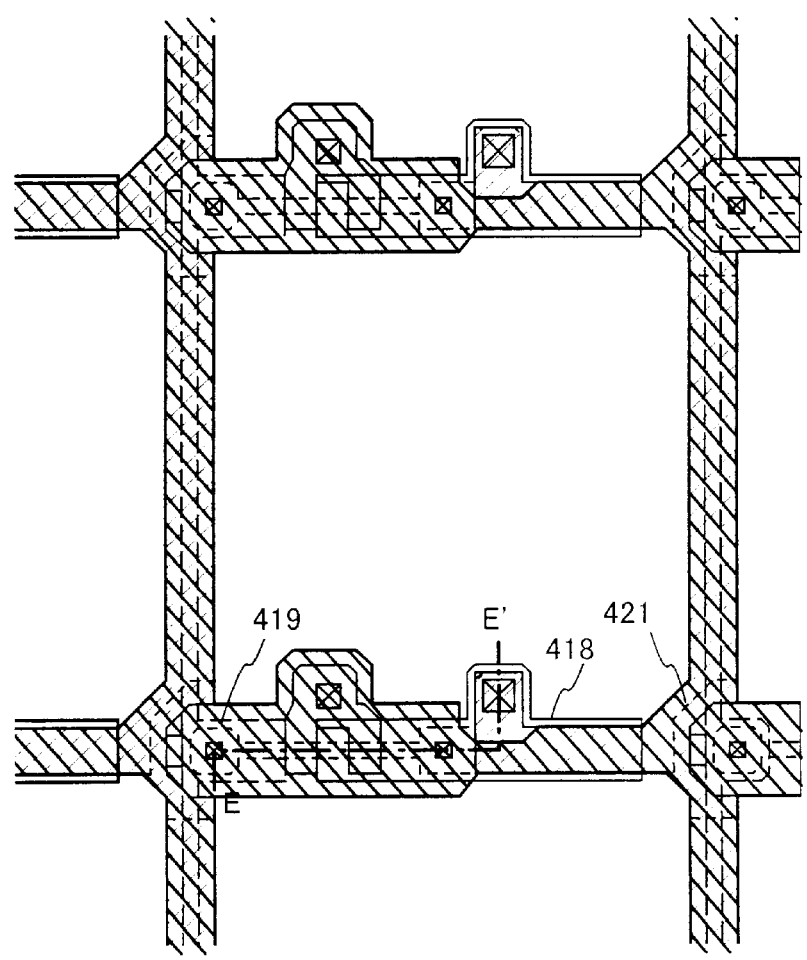

After hydrogenation treatment is conducted, an interlayer insulating film 420 made of an acrylic resin is formed. Next, a conductive film having a light shielding property is formed to a thickness of 100 nm on the interlayer insulating film 420 to form a light shielding layer 421 (FIG. 8A). The sectional view taken along a dotted line E–E' in FIG. 8B corresponds to FIG. 8A. FIG. 8B corresponds also to FIG. 3D showing the foregoing embodiment, and like reference numerals are used to identify like constituent members.

Figure 9A:
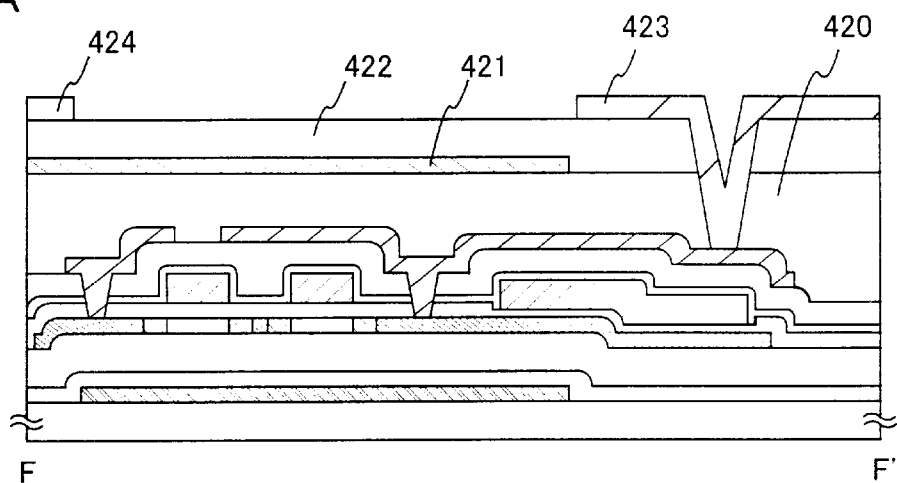
FIGS. 9A and 9B are a sectional view of fabrication steps of the pixel portion and its top view.
Figure 9B:
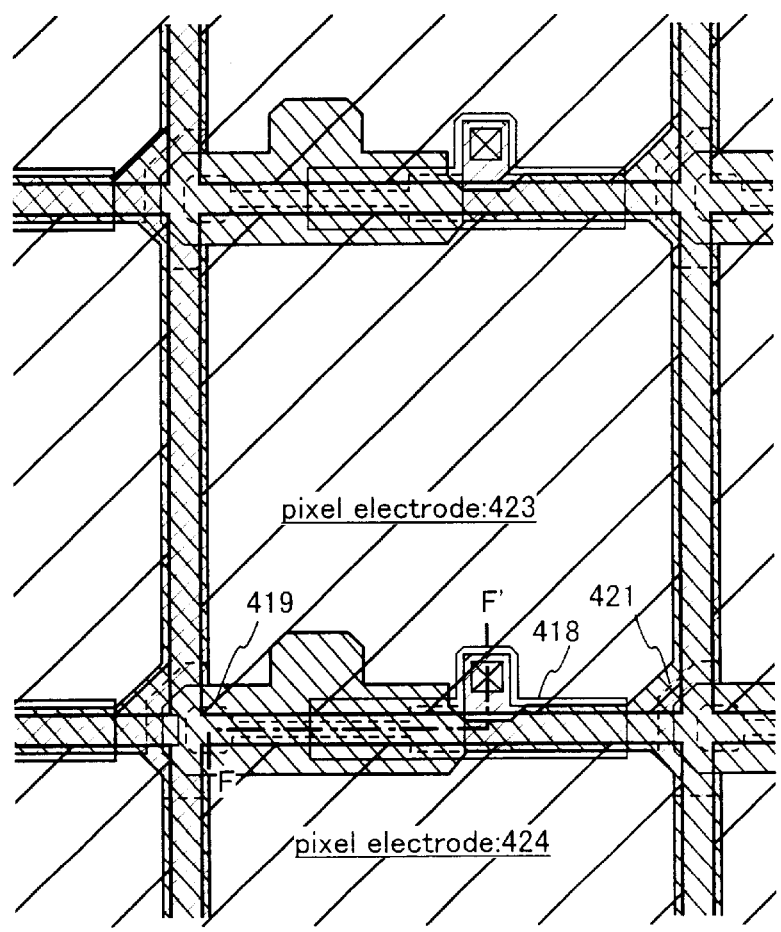

Next, an interlayer insulating film 422 is formed. Contact holes are then so formed as to reach the drain electrode 418. After a 100 nm-thick transparent conductive film (here, an indium oxide tin (ITO) film) is formed, it is patterned to form pixel electrodes 423 and 424 (FIG. 9A). The sectional view taken along a dotted lines F–F' in FIG. 9B corresponds to FIG. 9A. FIG. 9B corresponds also to FIG. 3E showing the foregoing example, and like reference numerals are used to identify like constituent members.

In this way, the pixel TFT comprising the n-channel TFT is formed in the pixel portion while the area (aperture ratio 74.5%) of the display region (pixel size of 23 $\mu$m×23 $\mu$m) is secured, and a sufficient storage capacitance (55.2 fF) can be acquired.

This embodiment represents one example, and the process steps of this embodiment are not naturally restrictive. For example, each conductive film can be made from an element selected from the group consisting of tantalum (Ta), titanium (Ti), molybdenum (Mo), tungsten (W), chromium (Cr) and silicon (Si), or an alloy film formed of the combination of these elements (typically, Mo—W alloy and Mo—Ta alloy). Each insulating film can use a silicon oxide film, a silicon nitride film, a silicon oxynitride film and organic resin materials (polyimide, acryl, polyamide, polyimideamide and BCB (benzocyclobutene)).

Figure 13:
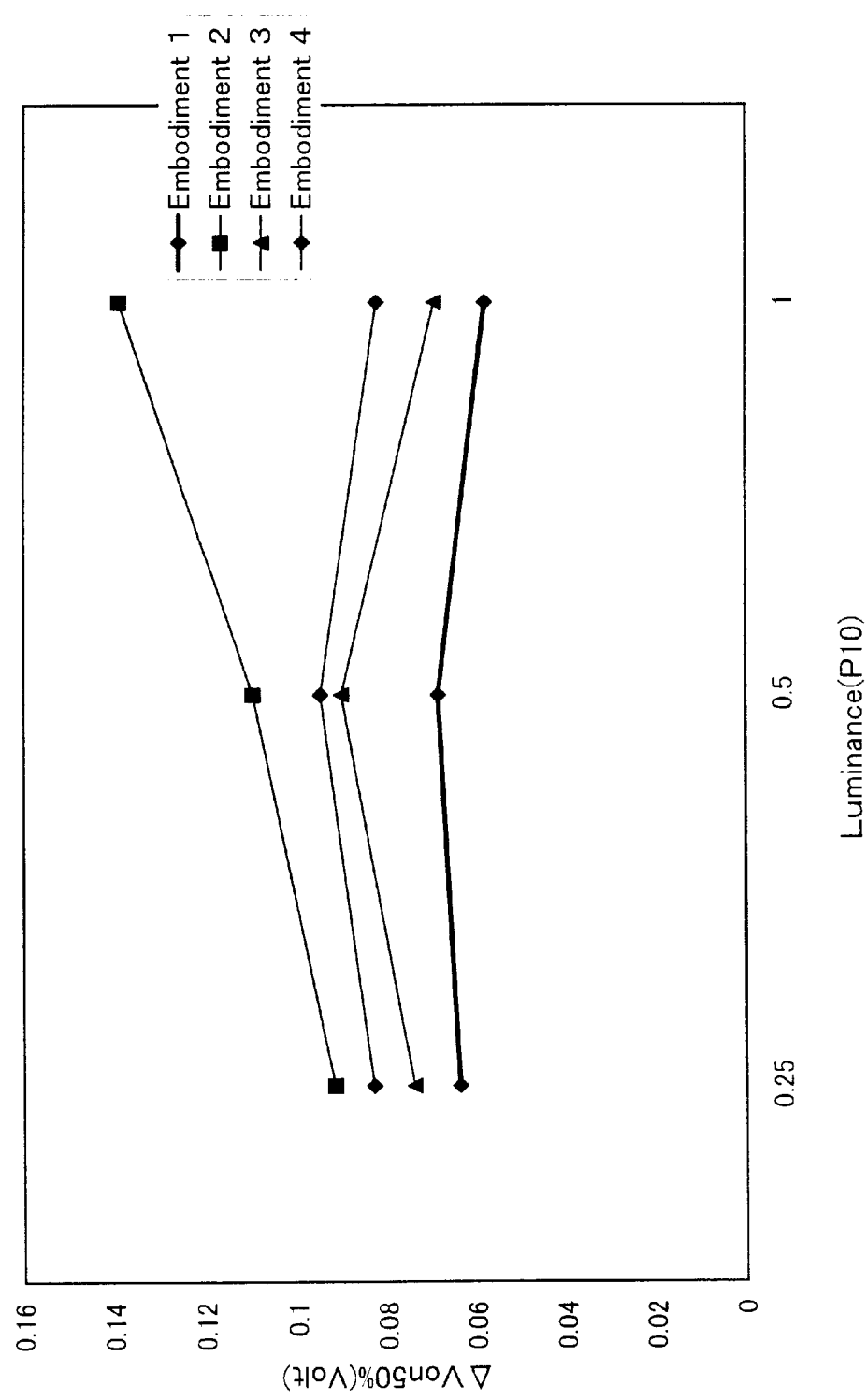
FIG. 13 is a graph showing the relation between ΔV and an optical intensity (Embodiments 1 to 4)

TFT obtained in this way has a small OFF current and is suitable as TFT of the pixel portion. Fluctuation of TFT characteristics is also small. FIG. 13 shows the relation between the optical intensity and $\Delta$V (fluctuation value of V–T curve) as fluctuation of TFT characteristics. In the V–T curve when light from the source light is set to 100% of transmissivity T, the V value is a value at the point that transmissivity T as the ordinate of the V–T curve is 50%. The $\Delta$V value is difference between the absolute voltage (V) values of the pixel impressed first and the pixel impressed finally in the pixel portion. It is possible to say that the smaller this $\Delta$V value, the smaller becomes fluctuation of the TFT characteristics. It can also be said that the smaller the light intensity of the abscissa (the light source used for measurement), the smaller becomes degradation to light.

Embodiment 2

Figure 10A:
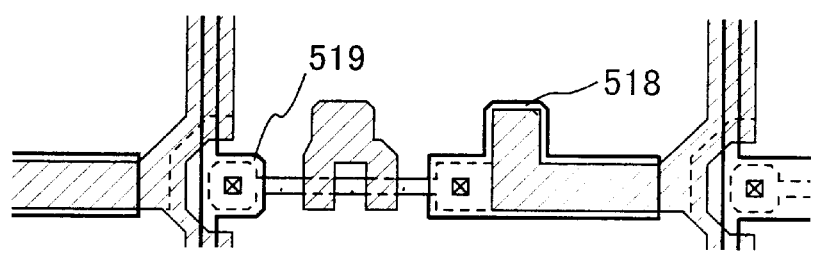
FIGS. 10A and 10B are top views of the pixel portion (Embodiment 2)
Figure 10B:
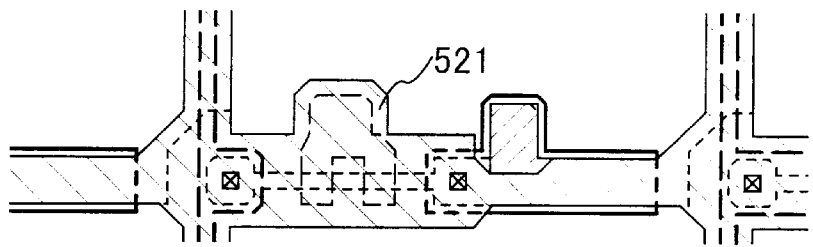

This embodiment uses a pixel structure shown in FIGS. 10A and 10B in place of the pixel structure of embodiment 1.

Since this embodiment has the same structure as embodiment 1 with the exception of the pattern shapes of the source line and drain electrodes, the explanation will be given on only the different point.

Embodiment 1 employs the construction in which the light shielding layer cuts off light traveling to the semiconductor layer, and further a part of the source line shields the semiconductor layer and the drain electrode partially overlapping with the gate electrode through the insulating film is disposed to shield the semiconductor layer. This example executes shielding of the semiconductor layer by means of only a light shielding layer 521 and the scanning line 402.

FIG. 10A corresponds to FIG. 7B2. A source line 519 is used in place of the source line 419 and a drain electrode 518 is used in place of the drain electrode 418. FIG. 10B corresponds to FIG. 8B, and a light shielding layer 521 has the same pattern shape as that of the light shielding layer 421.

FIG. 13 shows fluctuation of TFT characteristics in this embodiment in terms of the relation between the optical intensity and $\Delta$V (fluctuation value of a V–T curve). In comparison with Example 1, fluctuation of TFT is greater in this embodiment. However, the pixel structure of this embodiment can reduce the parasitic capacitance formed by the gate electrode, the drain electrode and the insulating film interposed between these electrodes in embodiment 1.

Embodiment 3

Figure 11:
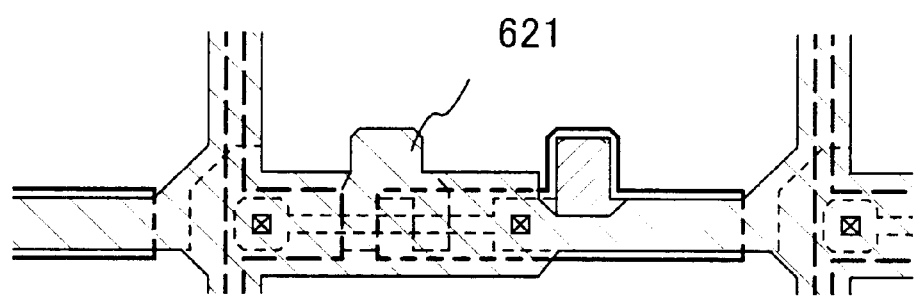
FIG. 11 is a top view of the pixel portion (Embodiment 3)

This embodiment represents an example where the pixel structure shown in FIG. 11 is used in place of the pixel structure of embodiment 1.

This example has the same construction as that of embodiment 1 with the exception that the pattern shape of the light shielding layer is different from that of embodiment 1. Therefore, the explanation will be given on only the different point.

In embodiment 1, the pattern shape of the light shielding layer completely covers the gate electrodes (the end part of the gate electrode does not coincide with that of the light shielding layer). In this embodiment, the pattern shape of the light shielding layer is smaller than that of the embodiment 1 and the end part of the light shielding layer 621 coincides with the end part of the gate electrode.

FIG. 11 corresponds to FIG. 8B and the light shielding layer 621 has a different pattern from the light shielding layer 421.

FIG. 13 shows fluctuation of TFT characteristics in this embodiment in terms of the relation between the optical intensity and $\Delta$V (fluctuation value of a V–T curve). In comparison with embodiment 1, fluctuation of TFT is greater in this embodiment. However, the pixel structure of this embodiment can improve the aperture ratio. It can be appreciated from the experimental results of this embodiment and of embodiment 1 that the mere pattern shape of the light shielding layer can affect characteristic fluctuation.

Embodiment 4

Figure 12A:
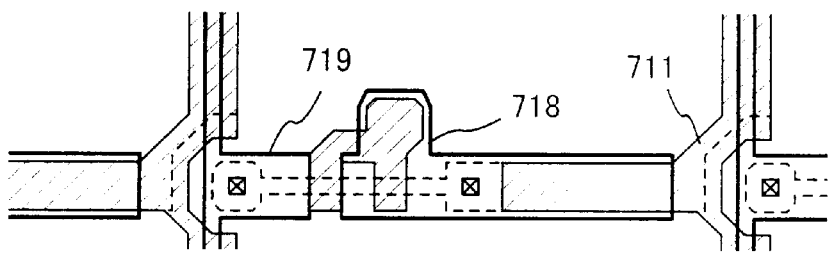
FIGS. 12A through 12C are top views of the pixel portion (Embodiment 4)
Figure 12B:
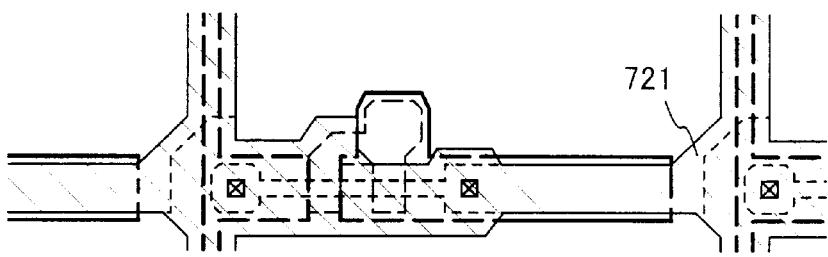
Figure 12C:
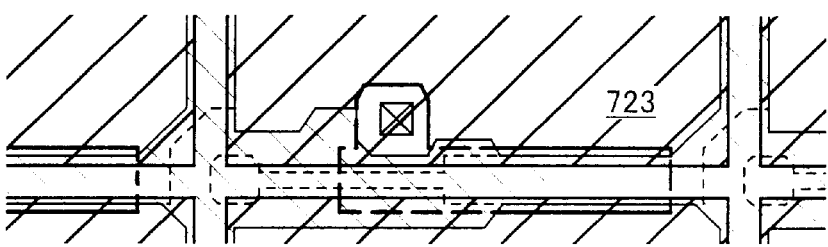

This embodiment represents an example where the pixel structure shown in FIGS. 12A through 12C is used in place of the pixel structure of embodiment 1.

Since this embodiment has the same construction as that of embodiment 1 with the exception that the contact position of each pixel electrode is different, the explanation will be given on only different point.

Embodiment 1 employs the construction in which the contact position between the drain electrode and the pixel electrode is spaced apart from the contact position between the gate electrode and the scanning line. However, this embodiment arranges both contact positions at substantially the same position. As shown in FIGS. 12A through 12C, the pattern shape of the semiconductor layer and the shape of the capacitance wire are changed to a certain extent, too.

FIG. 12A corresponds to FIG. 7B2. A source line 719 is used in place of the source line 419 and a drain electrode 718 is used in place of the drain electrode 418. FIG. 12B corresponds to FIG. 8B. A light shielding layer 721 having a different pattern shape from the light shielding layer 421 is used. FIG. 12C corresponds to FIGS. 9A and 9B, and a pixel electrode 723 having the same pattern shape as that of the pixel electrode 423 is used.

FIG. 13 shows fluctuation of TFT characteristics in this embodiment in terms of the relation between the optical intensity and ΔV (fluctuation value of a V–T curve). In comparison with embodiment 1, fluctuation of TFT is greater in this embodiment. However, the pixel structure of this example can improve the aperture ratio. It can be appreciated from the experimental results of this embodiment and of embodiment 1 that the mere contact position of the pixel electrode can affect characteristic fluctuation.

Embodiment 5

This example represents a TFT structure different from that of Example 1.

Figure 14A:
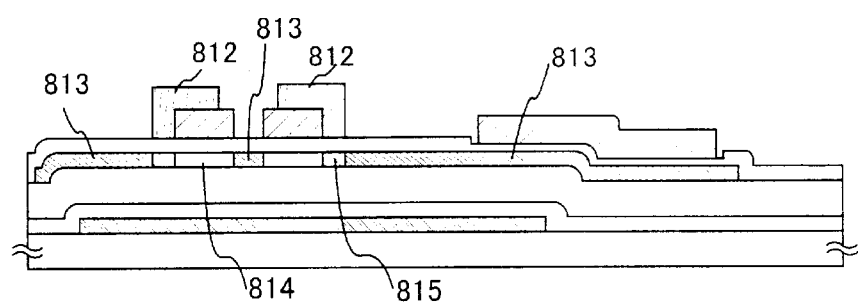
FIGS. 14A through 14C are sectional views of fabrication steps of the pixel portion (Embodiment 5)

The TFT structure of embodiment 1 has a structure including two channel formation regions between the source region and the drain region (double gate structure). Such a double gate structure is effective because it provides redundancy to characteristic defects of TFT. However, due to the double gate structure in TFT of embodiment 1, the area occupied by TFT for one pixel becomes great and the aperture ratio drops. Therefore, this embodiment changes the design of the resist mask 412 to a resist mask 812 in the process step of FIG. 7A so that the low concentration impurity region (LDD region) is not disposed between the two channel formation regions as shown in FIG. 14A. Incidentally, the device substrate may be formed in accordance with the process steps of Example 1 up to the step shown in FIG. 7A. High concentration doping is conducted by using the resist mask 812 shown in FIG. 14A as the mask to form a high concentration impurity region 813. The semiconductor region between the two channel formation regions 814 is a high concentration impurity region 813 containing the impurity element to the equal extent as the source or drain region. The TFT structure of this embodiment can shorten the gap between the two channel formation regions 814 and can decrease the occupying area of TFT for one pixel.

Figure 14B:
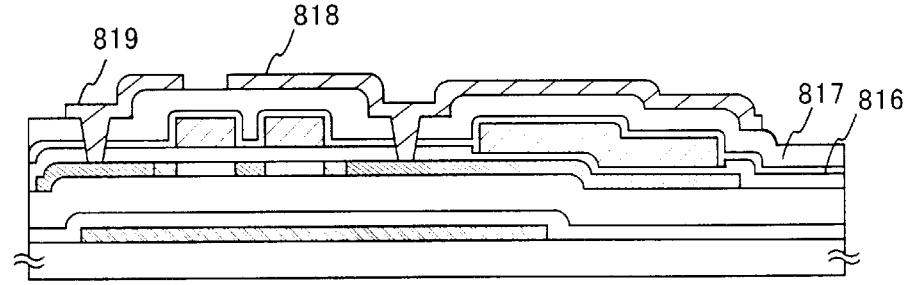

Next, after the mask is removed in the same way as in embodiment 1, insulation films 816 and 817 are formed in such a manner as to cover the gate electrode and the capacitance wire. A source line 819 (inclusive of a source electrode) connected to a semiconductor layer and a drain electrode 818 connected to the semiconductor layer are simultaneously formed on the insulating films (FIG. 14B). At this stage, the semiconductor layer overlaps with at least one of the gate electrode, the source line and the drain electrode throughout the full region of the semiconductor layer. Incidentally, a part of the source line or a part of the drain electrode functions as a second light shielding layer.

Next, an insulating film is formed in such a manner as to cover the source line or the drain electrode, and a third light shielding layer 821 is formed on this insulating film. Incidentally, a pattern peripheral part of the third light shielding layer is arranged with a certain margin outside the pattern of the gate electrode. Since the second and third light shielding layers are disposed in this way, it is possible to prevent the rays of light diffracted at the end part of the third light shielding layer from being irradiated to the semiconductor layer.

Figure 14C:
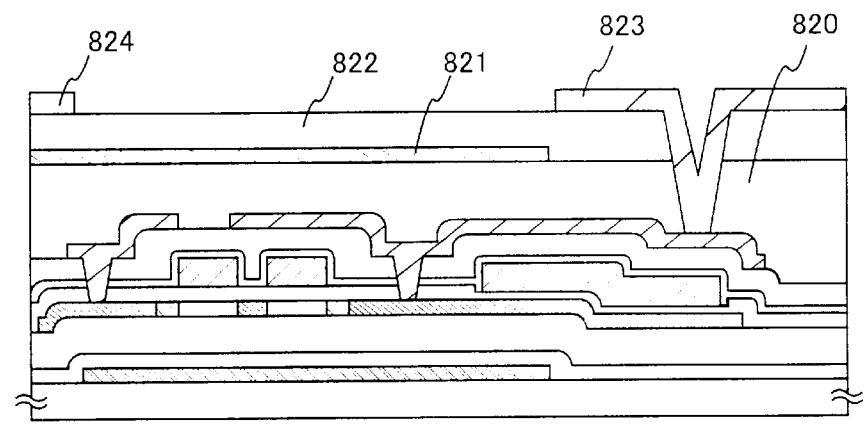

An insulating film covering the third light shielding layer is formed and pixel electrodes 823 connected to drain electrodes are formed on the insulating film (FIG. 14C). Because the third light shielding layer cannot be arranged to the connection positions between the pixel electrodes and the drain electrodes, it is preferred to secure a distance from the channel formation region as much as possible.

Figure 15:
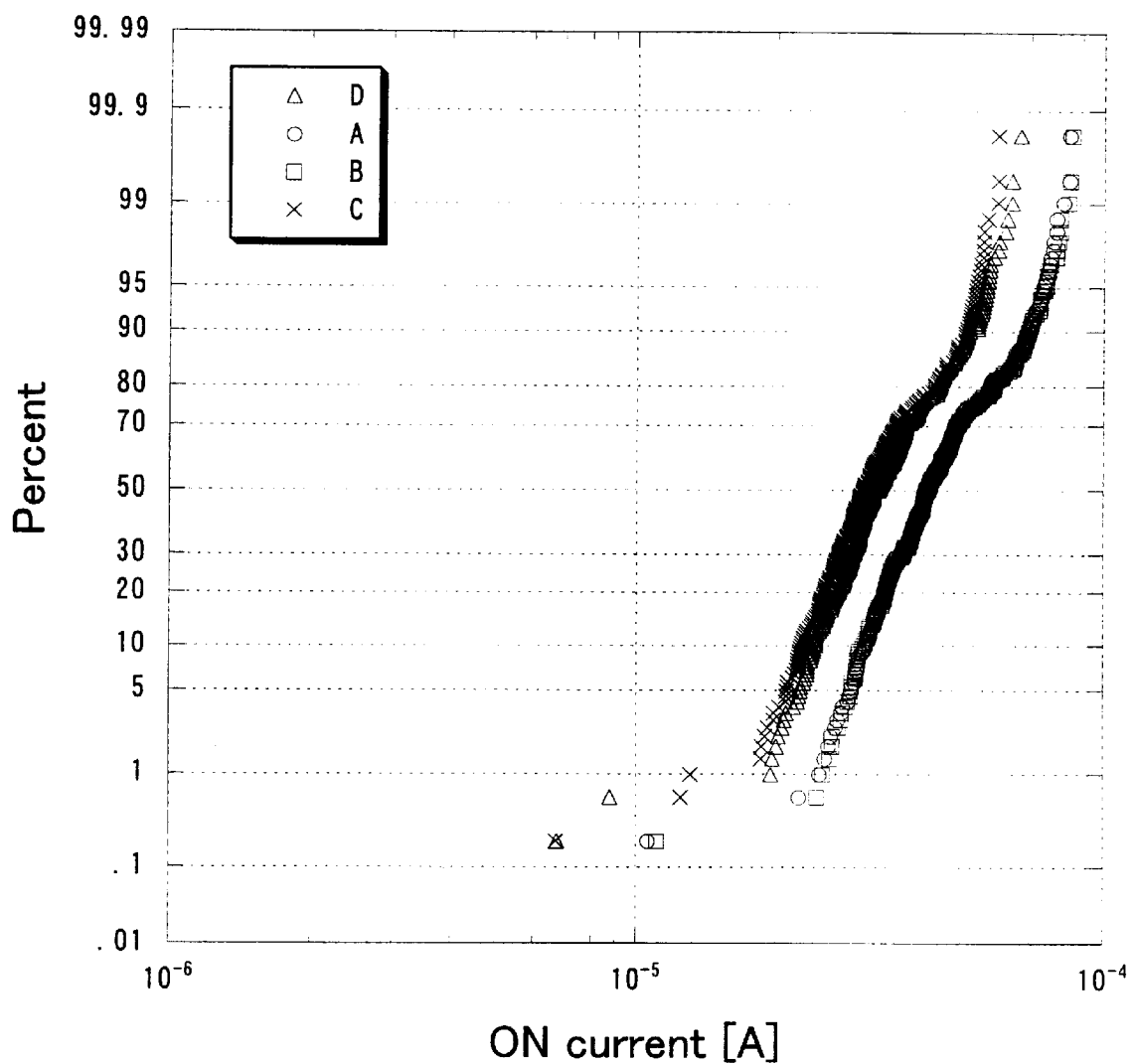
FIG. 15 is a distribution diagram of an ON current value (Embodiment 5)

The TFT structure of this embodiment has a greater ON current value (ON current value exhibiting a maximum value of a probability distribution curve=$4.24 \times 10^{-5}$ A) than the ON current value of TFT of embodiment 1 (ON current value exhibiting a maximum value of a probability distribution curve=$3.09 \times 10^{-5}$ A) and is extremely effective. FIG. 15 shows a probability distribution diagram of an ON current value.

Figure 16:
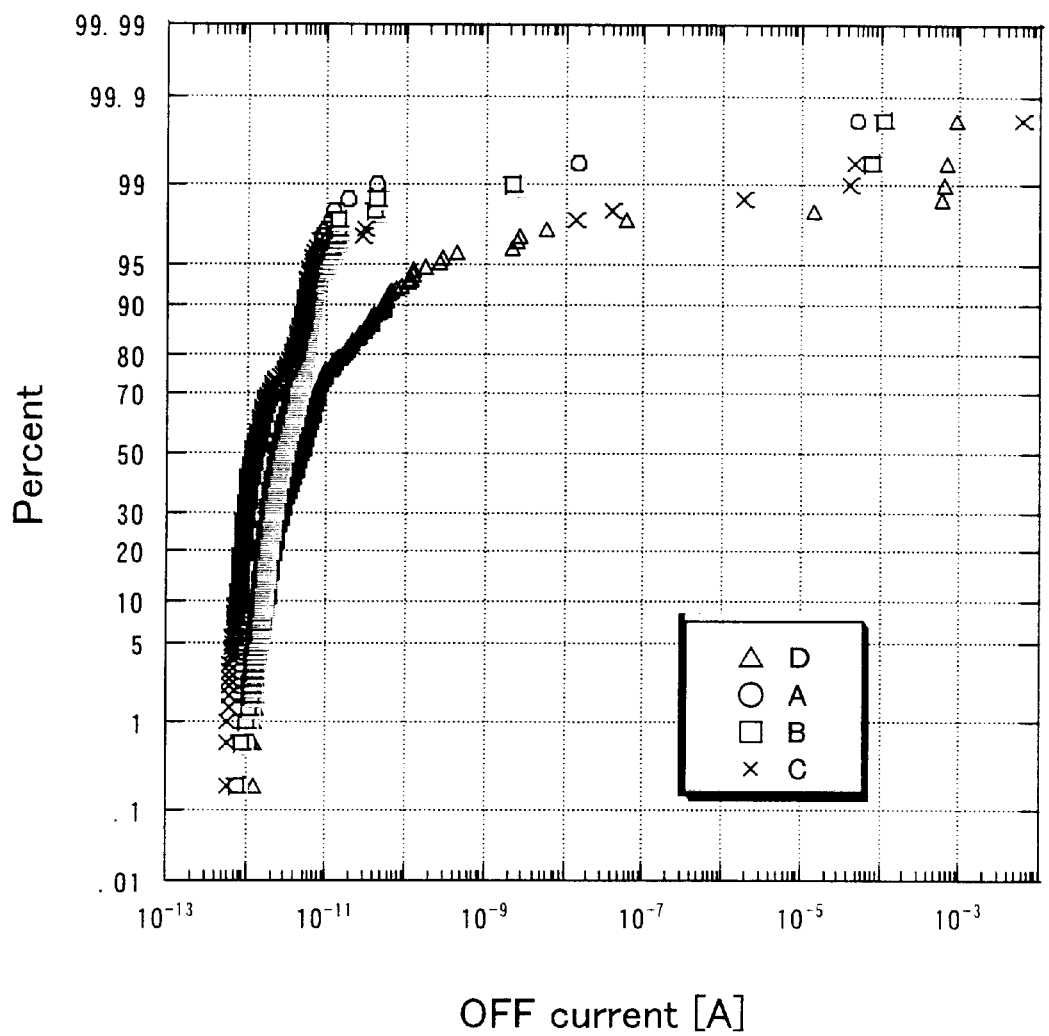
FIG. 16 is a distribution diagram of an OFF current value (Embodiment 5)

FIG. 16 shows a probability distribution diagram of an OFF current value. In comparison with embodiment 1, the OFF current value of TFT of this embodiment is substantially equal. In FIGS. 15 and 16, a sample A in which the gap between the two channel formation regions is 1 μm and a sample B in which the gap is 2 μm are compared with each other. For comparison with this embodiment, a sample C having the TFT structure of embodiment 1 is prepared, and the measurement result is also shown in the drawings. In addition, for comparison with this embodiment, a sample D in which only a low concentration impurity region (LDD region: 1 μm) is formed between the two channel formation regions is prepared, and the measurement result is also shown in the drawings.

The TFT structure of this embodiment can reduce the occurrence ratio of the abnormal OFF current of TFT and can improve the production yield. The occurrence ratio of the abnormal OFF current of each TFT is calculated. The proportion of the number of pixels in which the OFF current exceeds 100 fA to the sample having 12×17 pixels arranged in matrix is calculated as the occurrence ratio of the pixel having the abnormal OFF current value. As a result, the occurrence ratios of the sample A, B, C, and D are 1%, 2%, 3% and 17%, respectively. The sample A having the TFT structure of this embodiment has the lowest occurrence ratio of the abnormal OFF current.

The experimental results given above reveal that if the occupying area of TFT for one pixel can be reduced according to the TFT structure of this embodiment, the aperture ratio or the storage capacitance can be increased. It is possible, for example, to form the pixel TFT formed of the n-channel TFT while the area (aperture ratio 74.5%) of the display region (pixel size 23 μm×23 μm) equivalent to that of embodiment 1 is secured, and to acquire a storage capacitance (57.9 fF) that is greater than the storage capacitance of embodiment 1.

Further, this embodiment can be freely combined with any structure of embodiment 1 to embodiment 4.

Embodiment 6

The pixel portion fabricated by implementing the present invention can be utilized for various modules (active matrix liquid crystal module, active matrix EL module and active matrix EC module). Namely, the present invention is implemented respect to all of the electronic apparatuses whose display portion is incorporated with the pixel portion of the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 17A–17F, 18A–18D and 19A–19C.

Figures 17A, 17B:
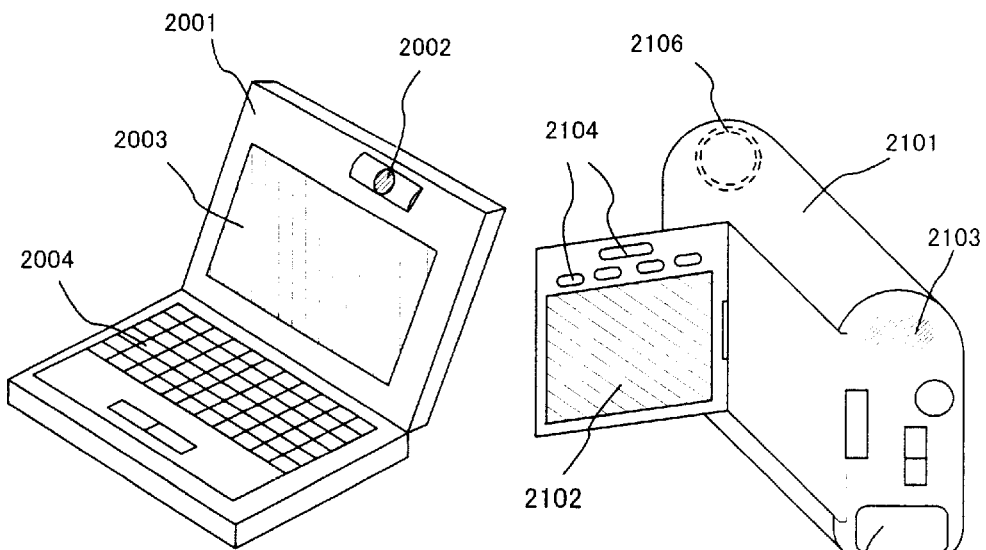
FIGS. 17A through 17F show examples of an electronic apparatus.

FIG. 17A is a personal computer, which comprises a main body 2001, an image input section 2002, a display section 2003, and a keyboard 2004. The present invention can be applied to the display section 2003.

FIG. 17B is a video camera which comprises a main body 2101, a display section 2102, a voice input section 2103, operation switches 2104, a battery 2105 and an image receiving section 2106. The present invention can be applied to the display section 2102.

Figures 17C, 17D:
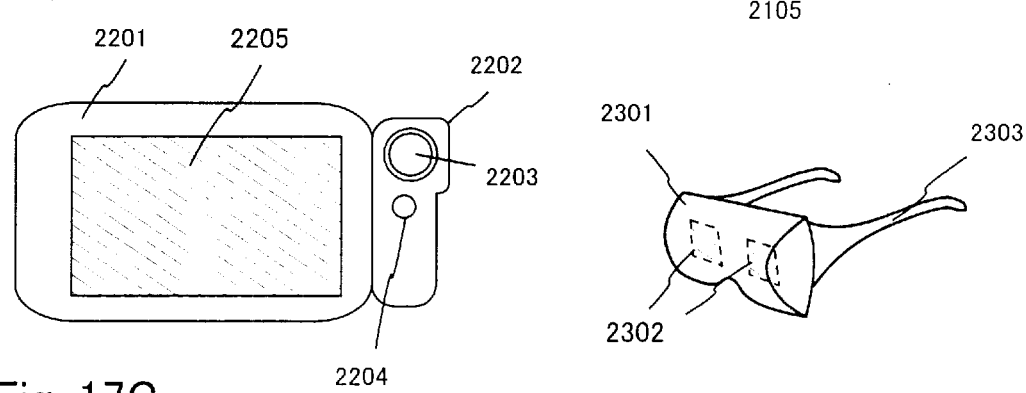

FIG. 17C is a mobile computer which comprises a main body 2201, a camera section 2202, an image receiving section 2203, operation switches 2204 and a display section 2205. The present invention can be applied to the display section 2205.

FIG. 17D is a goggle type display which comprises a main body 2301, a display section 2302, and an arm section 2303. The present invention can be applied to the display section 2302.

Figures 17E, 17F:
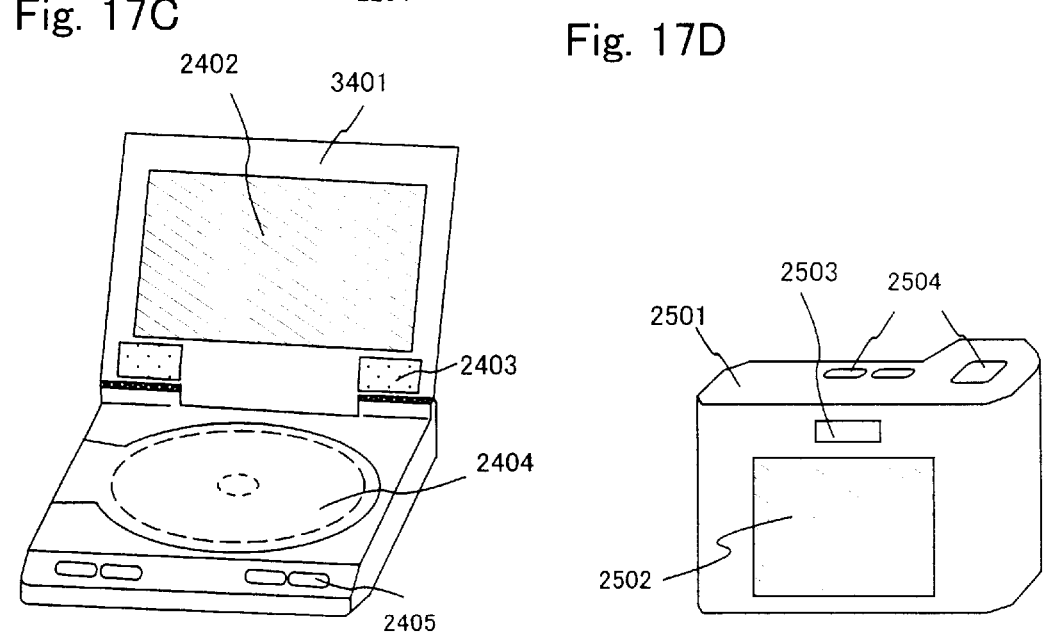

FIG. 17E is a player using a recording medium which records a program (hereinafter referred to as a recording medium) which comprises a main body 2401, a display section 2402, a speaker section 2403, a recording medium 2404, and operation switches 2405. This apparatus uses DVD (digital versatile disc), CD. etc. for the recording medium, and can perform music appreciation, film appreciation, games and use for Internet. The present invention can be applied to the display section 2402.

FIG. 17F is a digital camera which comprises a main body 2501: a display section 2502, a view finder 2503, operation switches 2504, and an image receiving section (not shown in the figure). The present invention can be applied to the display section 2502.

Figure 18A:
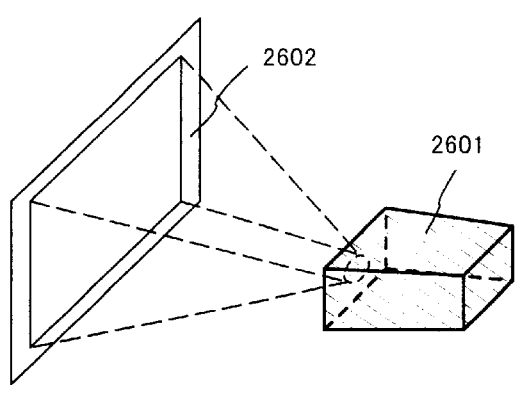
FIGS. 18A through 18D show another examples of the electronic apparatus.

FIG. 18A is a front type projector which comprises a projection system 2601 and a screen 2602. The present invention can be applied to the liquid crystal module 2808 shown in FIG. 18C which forms a part of the projection system 2601 to complete the whole system.

Figure 18B:
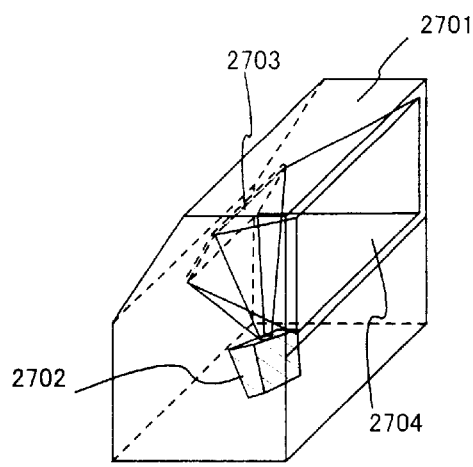

FIG. 18B is a rear type projector which comprises a main body 2701, a projection system 2702, a mirror 2703, and a screen 2704. The present invention can be applied to the liquid crystal module 2808 shown in FIG. 18C which forms a part of the projection system 2702 to complete the whole system.

Figure 18C:
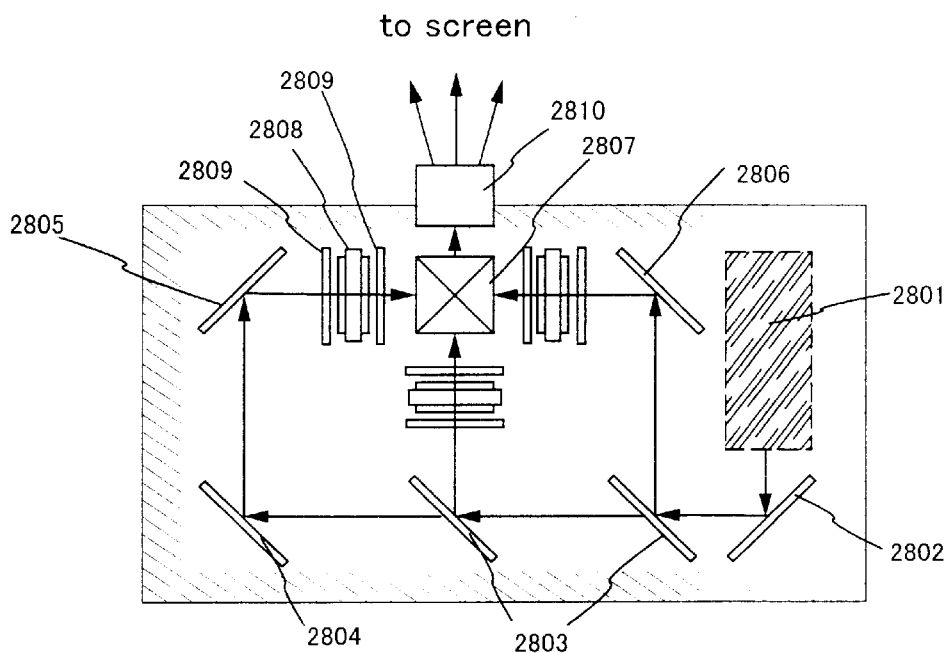

FIG. 18C is a diagram which shows an example of the structure of a projection system 2601 and 2702 in FIGS. 18A and 18B, respectively. Each of projection systems 2601 and 2702 comprises an optical light source system 2801, mirrors 2802 and 2804 to 2806, a dichroic mirror 2803, a prism 2807, a liquid crystal module 2808, a phase differentiating plate 2809, and a projection optical system 2810. The projection optical system 2810 comprises an optical system having a projection lens. Though this example shows an example of 3-plate type, this is not to limit to this example and a single plate type may be used for instance. Further, an operator may appropriately dispose an optical lens, a film which has a function to polarize light, a film which adjusts a phase difference or an IR film, etc. in the optical path shown by an arrow in FIG. 18C.

Figure 18D:
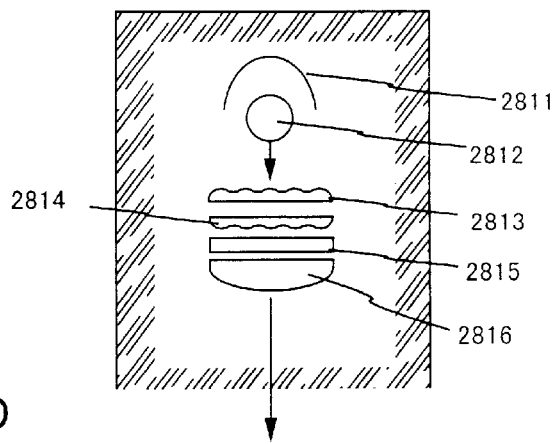

FIG. 18D is a diagram showing an example of a structure of an optical light source system 2801 in FIG. 18C. In this embodiment, the optical light source system 2801 comprises a reflector 2811, a light source 2812, lens arrays 2813 and 2814, a polarizer conversion element 2815, and a collimator lens 2816. Note that the optical light source system shown in FIG. 18D is merely an example and the structure is not limited to this example. For instance, an operator may appropriately dispose an optical lens, a film which has a function to polarize light, a film which adjusts a phase difference or an IR film, etc.

Note that the projectors shown FIGS. 18A through 18D are the cases of using a transmission type electro-optical device, and applicable examples of a reflection type electro-optical device and an EL module are not shown.

Figure 19A:
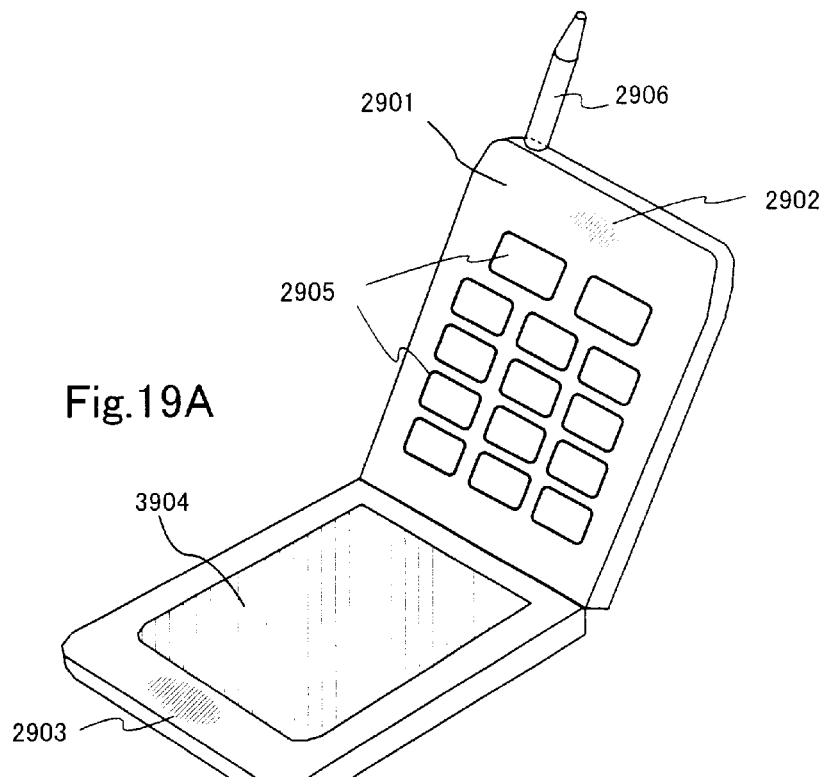
FIGS. 19A through 19C show still another example of the electronic apparatus.

FIG. 19A is a mobile phone which comprises a main body 2901, a voice output section 2902, a voice input section 2903, a display section 2904, operation switches 2905, an antenna 2906, and an image input section (CCD, image sensor, etc.) 2907 etc. The present invention can be applied to the display section 2904.

Figure 19B:
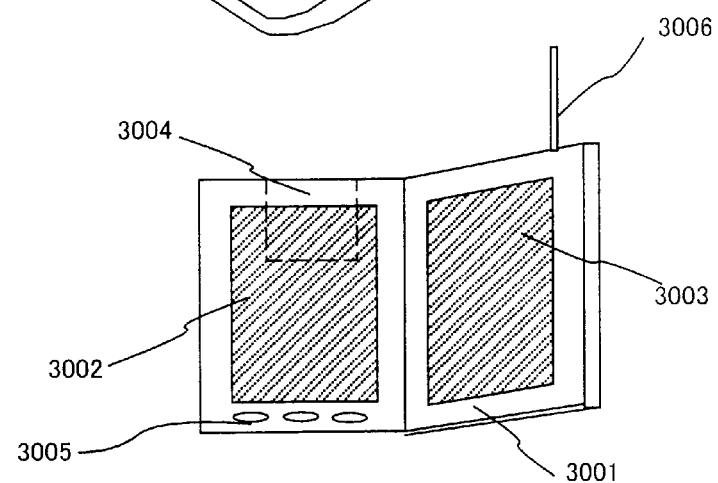

FIG. 19B is a portable book (electronic book) which comprises a main body 3001, display sections 3002 and 3003, a recording medium 3004, operation switches 3005 and an antenna 3006 etc. The present invention can be applied to the display sections 3002 and 3003.

Figure 19C:
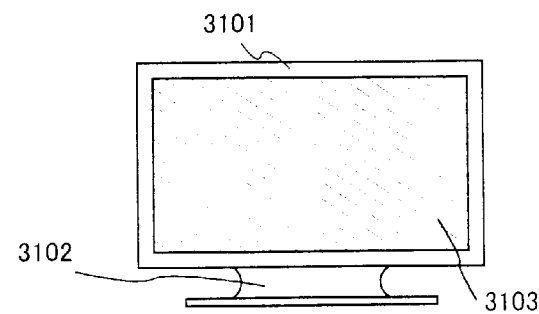

FIG. 19C is a display which comprises a main body 3101, a supporting section 3102, and a display section 3103 etc. The present invention can be applied to the display section 3103.

In addition, the display shown in FIG. 19C is small and medium type or large type, for example, screen of the display sized 5 to 20 inches. Moreover, it is preferable to mass-produce to form such sized display section by executing a multiple pattern using a substrate having its side of 1 m.

As described above, the applicable range of the present invention is very large, and the invention can be applied to electronic apparatuses of various areas. Note that the electronic devices of this embodiment can be achieved by utilizing any combination of constitutions in embodiment 1 to embodiment 5.

This invention can cut off the rays of light diffracted by the light shielding layer disposed over the semiconductor layer and can suppress fluctuation of TFT characteristics arranged for each pixel, typically the OFF current, and degradation of image quality.

The invention can increase the storage capacitance. Since each of a plurality of pixels connected to each scanning line has an independent storage capacitance, each pixel is not affected by a write current of an adjacent pixel even when a signal writing operation is continuously or simultaneously conducted to the adjacent pixel. Since the current load is dispersed time-wise, an effective load to each capacitance wire can be reduced and the requirement for each capacitance wire resistance can be mitigated.

Therefore, a liquid crystal display device according to the invention can acquire a liquid crystal display device having a high aperture ratio and a storage capacitance capable of holding a sufficient display signal potential inside each pixel. Consequently, the invention can reduce the size of the device and power consumption, and can obtain an excellent display image.

What is claimed is:

1. A semiconductor device comprising:
   a semiconductor layer on an insulating surface;
   a first insulating film on said semiconductor layer;

a gate electrode formed over said semiconductor layer with said first insulating film interposed therebetween;

a second insulating film on said gate electrode;

a first light shielding layer on said second insulating film;

a third insulating film on said first light shielding layer; and a second light shielding layer on said third insulating film, wherein said first light shielding layer and said gate electrode are arranged more inward than a peripheral edge part of said second light shielding layer in such a manner as to cut off rays of light diffracted by said second light shielding layer when said rays of light are irradiated from said second light shielding layer toward said semiconductor layer.

2. The semiconductor device according to claim 1, wherein said first insulating film is a gate insulating film.

3. The semiconductor device according to claims 1, wherein said gate electrode is patterned into an island shape.

4. The semiconductor device according to claim 1, wherein said gate electrode comprises a film including an element selected from the group consisting of poly-Si doped with an impurity element imparting conductivity type, W, $WSi_x$, Al, Ta, Cr and Mo.

5. A semiconductor device comprising:

a semiconductor layer on an insulating surface;

a first insulating film on said semiconductor layer;

a gate electrode formed over said semiconductor layer with said first insulating film interposed therebetween;

a second insulating film on said gate electrode;

a first light shielding layer on said second insulating film;

a third insulating film on said first light shielding layer; and a second light shielding layer on said third insulating film, wherein said second light shielding layer and at least one of said gate electrode and said first light shielding layer are so arranged as to overlap with each other over a full region of said semiconductor layer in a pixel portion.

6. The semiconductor device according to claim 5, wherein said first insulating film is a gate insulating film.

7. The semiconductor device according to claims 5, wherein said gate electrode is patterned into an island shape.

8. The semiconductor device according to claim 5, wherein said gate electrode comprises a film including an element selected from the group consisting of poly-Si doped with an impurity element imparting conductivity type, W, $WSi_x$, Al, Ta, Cr and Mo.

9. A semiconductor device including:

a first light shielding layer on an insulating surface;

a first insulating film over said first light shielding layer;

a semiconductor layer on said first insulating film;

a second insulating film on said semiconductor layer;

a wire and a gate electrode formed on said second insulating film, wherein said gate electrode is connected to said first light shielding layer;

a third insulating film on said wire and on said gate electrode;

a second light shielding layer formed over said semiconductor layer with said third insulating film interposed therebetween;

a fourth insulating film on said second light shielding layer; and a third light shielding layer on said fourth insulating film;

wherein said second light shielding layer and said gate electrode cut off rays of light diffracted by said third light shielding layer when said rays of light are irradiated from said third light shielding layer towards said semiconductor layer.

10. The semiconductor device according to claim 9, wherein said semiconductor layer and said wire overlap with each other through said second insulating film.

11. The semiconductor device according to claim 9, wherein a storage capacitance using said second insulating film as a dielectric is formed in a region in which said wire and said semiconductor layer overlap with each other through said second insulating film.

12. The semiconductor device according to claim 9, wherein an impurity element for imparting conductivity type is doped into a region of said semiconductor layer which overlaps with said wire through said second insulating film.

13. The semiconductor device according to claim 9, further comprising an electrode contacted with said semiconductor layer on said third insulating film and a pixel electrode connected to said electrode.

14. The semiconductor device according to claim 13, wherein said electrode contacted with said semiconductor layer on said third insulating film is equal to said second light shielding layer.

15. The semiconductor device according to claim 9, wherein said first light shielding layer is a scanning line.

16. The semiconductor device according to claim 9, wherein said wire is a capacitance wire.

17. The semiconductor device according to claim 9, wherein said second insulating film is a gate insulating film.

18. The semiconductor device according to claims 9, wherein said gate electrode is patterned into an island shape.

19. The semiconductor device according to claim 9, wherein said gate electrode comprises a film including an element selected from the group consisting of poly-Si doped with an impurity element imparting conductivity type, W, $WSi_x$, Al, Ta, Cr and Mo.

20. A semiconductor device comprising:

a scanning line formed over a substrate;

a first insulating film formed over said scanning line;

a semiconductor island formed over the first insulating film, including a source region, a drain region, a first channel formation region and a second channel formation region between said source region and the said drain region;

a first gate electrode and a second gate electrode formed over said first channel formation region and said second channel formation region with a gate insulating film interposed therebetween, respectively, wherein said first gate electrode and said second gate electrode are electrically connected with said scanning line;

a second insulating film formed on said first gate electrode and said second gate electrodes;

a source electrode and a drain electrode formed over said second insulating film, wherein said drain electrode is connected with said drain region and covers said first gate electrode and a part of said second gate electrode with said second insulating film interposed therebetween;

a third insulating film formed on said source electrode and said drain electrode;

a light shielding layer formed on said third insulating film, wherein said source electrode, said drain electrode, said first gate electrode, and said second gate electrode are arranged more inward than a peripheral edge part of said light shielding layer in such a manner as to cut off rays of light diffracted by said light shielding layer when said rays of light are irradiated from said light shielding layer toward said semiconductor layer.

21. A semiconductor device comprising:

a semiconductor island formed over a substrate, including a source region, a drain region, and at least a first channel formation region and a second channel formation region between said source region and said drain region;

a first gate electrode, a second gate electrode and a wire adjacent to said semiconductor island with a gate insulating film interposed therebetween;

a first insulating film formed on said first gate electrode, said second gate electrode and said wire;

a source electrode and a drain electrode formed over said first insulating film, wherein said drain electrode is connected with said drain region and covers said first gate electrode and a part of said second gate electrode with said first insulating film interposed therebetween;

a second insulating film formed on said source electrode and said drain electrode; and a light shielding layer formed on said second insulating film, wherein said semiconductor island overlaps at least one of said source electrode, said drain electrode, said first gate electrode, said second gate electrode, and said light shielding layer in such a manner as to cut off rays of light diffracted by said light shielding layer when said rays of light are irradiated from said light shielding layer toward said semiconductor layer, and wherein a part of said semiconductor island, said gate insulating film, and said wire constitute a storage capacitor.

22. A semiconductor device comprising:

a semiconductor layer on an insulating surface;

a gate electrode formed over said semiconductor layer;

a first light shielding layer over said gate electrode; and a second light shielding layer over said first light shielding layer, wherein said first light shielding layer and said gate electrode are arranged more inward than a peripheral edge part of said second light shielding layer in such a manner as to cut off rays of light diffracted by said second light shielding layer when said rays of light are irradiated from said second light shielding layer toward said semiconductor layer.

23. The semiconductor device according to claim 22, wherein said gate electrode is patterned into an island shape.

24. The semiconductor device according to claim 22, wherein said gate electrode comprises a film including an element selected from the group consisting of poly-Si doped with an impurity element imparting conductivity type, W, $WSi_x$, Al, Ta, Cr and Mo.

25. A semiconductor device comprising:

a semiconductor layer on an insulating surface;

a gate electrode formed over said semiconductor layer;

a first light shielding layer over said gate electrode; and a second light shielding layer over said first light shielding layer, wherein said second light shielding layer and at least one of said gate electrode and said first light shielding layer are so arranged as to overlap with each other over a full region of said semiconductor layer in a pixel portion.

26. The semiconductor device according to claim 25, wherein said gate electrode is patterned into an island shape.

27. The semiconductor device according to claim 25, wherein said gate electrode comprises a film including an element selected from the group consisting of poly-Si doped with an impurity element imparting conductivity type, W, $WSi_x$, Al, Ta, Cr and Mo.

28. A semiconductor device including:

a first light shielding layer on an insulating surface;

a semiconductor layer over said first light shielding layer;

a wire and a gate electrode formed over said semiconductor layer, wherein said gate electrode is connected to said first light shielding layer;

a second light shielding layer formed over said semiconductor layer; and a third light shielding layer over said second light shielding layer;

wherein said second light shielding layer and said gate electrode cut off rays of light diffracted by said third light shielding layer when said rays of light are irradiated from said third light shielding layer towards said semiconductor layer.

29. The semiconductor device according to claim 28, wherein said semiconductor layer and said wire overlap with each other.

30. The semiconductor device according to claim 28, wherein a storage capacitance is formed in a region in which said wire and said semiconductor layer overlap with each other.

31. The semiconductor device according to claim 28, wherein an impurity element for imparting conductivity type is doped into a region of said semiconductor layer which overlaps with said wire.

32. The semiconductor device according to claim 28, further comprising an electrode contacted with said semiconductor layer and a pixel electrode connected to said electrode.

33. The semiconductor device according to claim 32, wherein said electrode contacted with said semiconductor layer is equal to said second light shielding layer.

34. The semiconductor device according to claim 28, wherein said first light shielding layer is a scanning line.

35. The semiconductor device according to claim 28, wherein said wire is a capacitance wire.

36. The semiconductor device according to claim 28, wherein said gate electrode is patterned into an island shape.

37. The semiconductor device according to claim 28, wherein said gate electrode comprises a film including an element selected from the group consisting of poly-Si doped with an impurity element imparting conductivity type, W, $WSi_x$, Al, Ta, Cr and Mo.

* * * * *